United States Patent
Boom et al.

(10) Patent No.: US 8,237,912 B2
(45) Date of Patent: Aug. 7, 2012

(54) LIQUID FILLED LENS ELEMENT, LITHOGRAPHIC APPARATUS COMPRISING SUCH AN ELEMENT AND DEVICE MANUFACTURING METHOD

(75) Inventors: Herman Boom, Eindhoven (NL); Borgert Kruizinga, Zoetermeer (NL); Martinus Hendrikus Antonius Leenders, Rhoon (NL); Johannes Catharinus Hubertus Mulkens, Waalre (NL); Huibert Visser, Zevenhuizen (NL); Peter Julian Pollard, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/043,192

(22) Filed: Mar. 8, 2011

(65) Prior Publication Data
US 2011/0194096 A1 Aug. 11, 2011

Related U.S. Application Data

(63) Continuation of application No. 11/478,307, filed on Jun. 30, 2006, now Pat. No. 7,969,549.

(51) Int. Cl.
*G03B 27/52* (2006.01)
(52) U.S. Cl. .......................................... 355/30; 355/53
(58) Field of Classification Search .................... 355/30, 355/53
See application file for complete search history.

(56) References Cited

U.S. PATENT DOCUMENTS

| | | | |
|---|---|---|---|
| 5,141,463 A * | 8/1992 | Rouse, Jr. ..................... | 446/221 |
| 5,378,514 A | 1/1995 | Hamada et al. | |
| 6,146,001 A | 11/2000 | Cwiakala | |
| 6,234,425 B1 | 5/2001 | Rand et al. | |
| 6,426,582 B1 | 7/2002 | Niederer et al. | |
| 2004/0166260 A1 * | 8/2004 | Phillips ....................... | 428/34.3 |
| 2005/0030501 A1 | 2/2005 | Mulkens et al. | |
| 2005/0098227 A1 | 5/2005 | Stanley | |
| 2005/0158673 A1 | 7/2005 | Hakey et al. | |
| 2006/0077369 A1 | 4/2006 | Wagner | |
| 2006/0098179 A1 | 5/2006 | Hirukawa | |
| 2006/0209286 A1 | 9/2006 | Nakano | |
| 2008/0106711 A1 | 5/2008 | Beierl et al. | |
| 2008/0170217 A1 | 7/2008 | Dodoc et al. | |
| 2009/0059189 A1 | 3/2009 | Goehnermeier et al. | |

FOREIGN PATENT DOCUMENTS

| | | |
|---|---|---|
| JP | 2006-6214596 | 8/2006 |
| WO | 2006/053751 | 5/2006 |
| WO | 2006/125538 | 11/2006 |

OTHER PUBLICATIONS

Search Report dated Jul. 1, 2010 in the corresponding Japanese Patent Application No. 2007-164949.

* cited by examiner

*Primary Examiner* — Edward Glick
*Assistant Examiner* — Mesfin T Asfaw
(74) *Attorney, Agent, or Firm* — Pillsbury Winthrop Shaw Pittman LLP

(57) ABSTRACT

A lens element, for use in a projection system, includes a concave side. The lens element further includes a membrane and a nozzle, the membrane at least covering the concave side of the lens element. The nozzle is arranged for supplying and/or removing a liquid and/or a gas in between the concave side and the membrane.

20 Claims, 18 Drawing Sheets

Fig 4a
*Prior art*
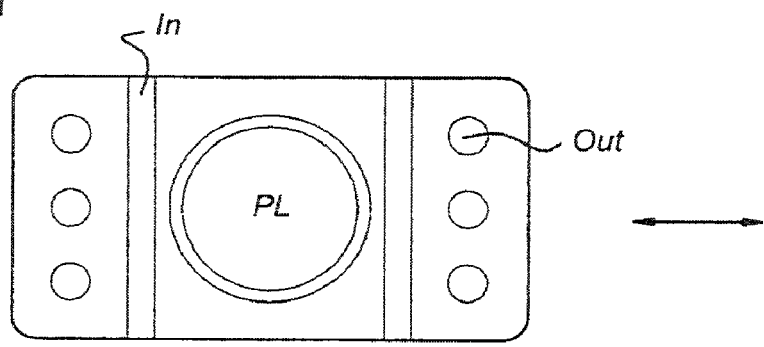
Fig 4b
*Prior art*
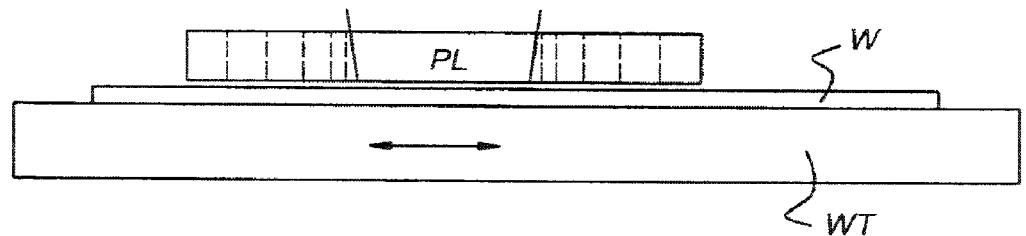
Fig 5  *Prior art*
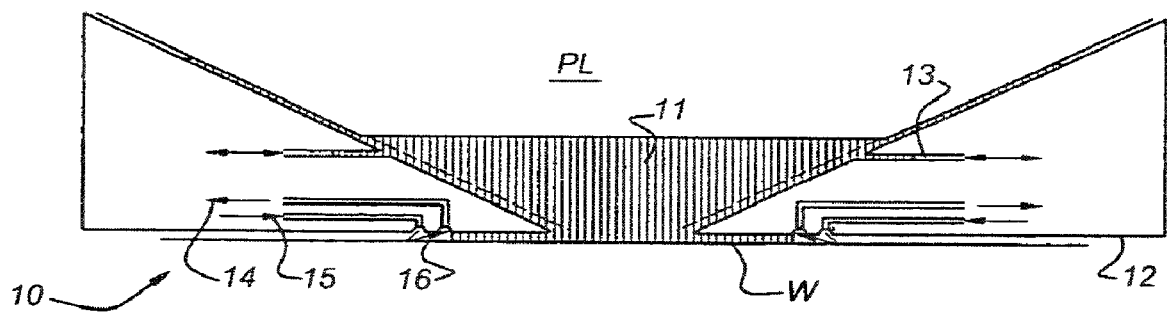

ical apparatus is a machine that applies a desired
LIQUID FILLED LENS ELEMENT, LITHOGRAPHIC APPARATUS COMPRISING SUCH AN ELEMENT AND DEVICE MANUFACTURING METHOD This application is a continuation of U.S. patent application Ser. No. 11/478,307, filed Jun. 30, 2006, now U.S. Pat. No. 7,969,549, the entire contents of the foregoing application is hereby incorporated by reference.

FIELD

The present invention relates to a liquid filled lens element, a lithographic apparatus comprising such an element and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective NA (when supported by the lens) of the system and also increasing the depth of focus.) Several immersion liquids have been proposed.

In the case of the immersion lithography in which the area between the substrate and a last lens of the projection system is filled with liquid, the lens numerical aperture (NA) is limited to one which is dependent on its refractive index (even if the refractive index of the liquid is greater than that of the lens) in order to prevent total internal reflection of the projected beam as it passes from the lens to the liquid on its path to the substrate. This limits the angles in which the projected beam can pass safely through the lens and the liquid to the substrate. One way to overcome this limitations is to make the lens out of a material with a larger refractive index, but none greater than n=1.56 is confirmed as being suitable for use at the time of the filing of this application.

Another way to overcome the limitation of the angles in which the projected beam can pass safely through the lens and the liquid to the substrate is described in U.S. patent application Ser. No. 10/959,403, filed Oct. 7, 2004, in the name of the assignee of this application. That application proposes to provide a curved lens element, in which the lens-liquid boundary is curved, i.e. a concave hollow lens-liquid boundary, by using a curved lens element. This enables a numerical aperture not to be limited by the refractive index of the material, but by the curvature of the surface of the lens.

In order to use such a curved lens element and an immersion liquid in a lithographic apparatus, the space between the curved lens element and a substrate or substrate table needs to be filled with immersion liquid.

SUMMARY

It is desirable to improve the techniques known from the prior art for filling the curved lens element with a liquid.

According to an embodiment of the invention, there is provided a lens element, for use in a projection system, the lens element comprising at least one concave side, wherein the lens element further comprises a membrane and a nozzle, the membrane at least covering the concave side of the lens element, and the nozzle being arranged for at least one of supplying and removing at least one of a liquid or gas in between the concave side and the membrane.

According to an embodiment of the invention, there is provided a method of supplying a liquid to a space in between a lens element of a projection system and a closing member, the lens element comprising at least one concave side, the closing member facing the concave side of the lens element, wherein the lens element comprises a membrane and a nozzle, the membrane at least covering the concave side of the lens element, and the nozzle being arranged to supply at least one of a liquid or a gas in between the concave side and the membrane, the method comprising a) supplying at least one of a liquid or a gas in between the concave side and the membrane via the nozzle, and b) supplying liquid in between the membrane and the closing member.

According to an embodiment of the invention, there is provided a method of supplying a liquid to a space in between a lens element of a projection system and a closing member, the lens element comprising at least one concave side, the closing member facing the concave side of the lens element, wherein the lens element comprises a membrane and a nozzle, the membrane at least covering the concave side of the lens element, and the nozzle being arranged to remove air from between the concave side and the membrane, the method comprising a) supplying liquid in between the concave side and the closing member, and b) extracting air from between the membrane and the closing member.

According to an embodiment of the invention, there is provided a membrane, comprising a first membrane layer and a second membrane layer, attached to each other to form an internal space, the membrane further comprising a nozzle, the nozzle being arranged for at least one of supplying and removing at least one of liquid or air in between the first membrane layer and the second membrane layer.

According to an embodiment of the invention, there is provided a method for providing a liquid to a space in between a concave lens element of a projection system and a closing member, the closing member facing the concave lens element, the method comprising a) providing a membrane according to claim 14 in the space under the concave lens element, b) supplying liquid in the space under the concave side and the closing member, c) supplying at least one of liquid or gas in between the first membrane layer and the second membrane layer via the nozzle, and d) removing the membrane from the space under the concave lens element.

According to an embodiment of the invention, there is provided a method for providing a liquid to a space in between a concave lens element of a projection system and a closing member, the closing member facing the concave lens element, the method comprising a) supplying liquid in the space between the concave side and the closing member, b) introducing a tube into the space and positioning an end of the tube near the concave lens element, c) apply a suction force to the tube in a direction away from the end of the tube near the concave lens element, and d) removing the tube from the space.

According to an embodiment of the invention, there is provided a tube for use in the method according to the above.

According to an embodiment of the invention, there is provided a probe head for use in the method according to the above.

According to an embodiment of the invention, there is provided a method of filling a space under a lens element with a liquid, where the space is limited at a first side by the lens element and at a second side by a closing member surface and where the liquid is being supplied to the space via an inlet, such that a liquid front travels through the space under the lens element, wherein a flow rate of the liquid through the inlet is controlled such that the velocity of the liquid front is below a first velocity $v_{mic}$, and a filling pressure does not exceed a threshold filling pressure such that the space is completely filled with the liquid.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 4a and 4b depict a view from above and a side-view respectively of liquid supply system according to another prior art lithographic projection apparatus;

FIG. 5 depicts a further view of the liquid supply system according to a prior art lithographic projection apparatus;

DETAILED DESCRIPTION

Figure 1:
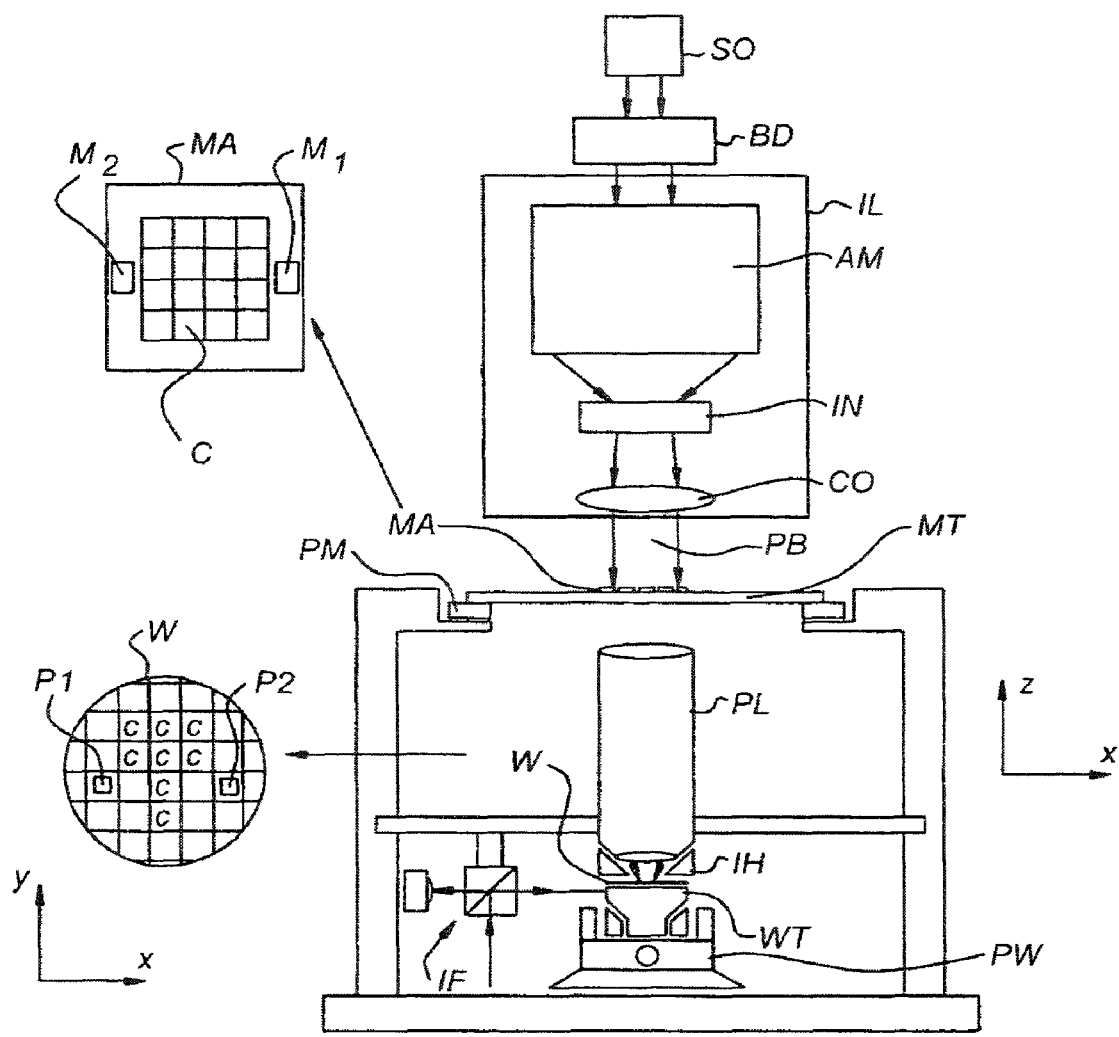
FIG. 1 depicts a lithographic apparatus according to an embodiment of the invention.

FIG. 1 schematically depicts a lithographic apparatus according to one embodiment of the invention. The apparatus comprises an illumination system (illuminator) IL configured to condition a radiation beam B (e.g. UV radiation or EUV radiation). A support (e.g. a mask table) MT is configured to support a patterning device (e.g. a mask) MA and is connected to a first positioner PM configured to accurately position the patterning device in accordance with certain parameters. A substrate table (e.g. a wafer table) WT is configured to hold a substrate (e.g. a resist-coated wafer) W and is connected to a second positioner PW configured to accurately position the substrate in accordance with certain parameters. A projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, to direct, shape, and/or control radiation.

The support supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support can use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion. C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
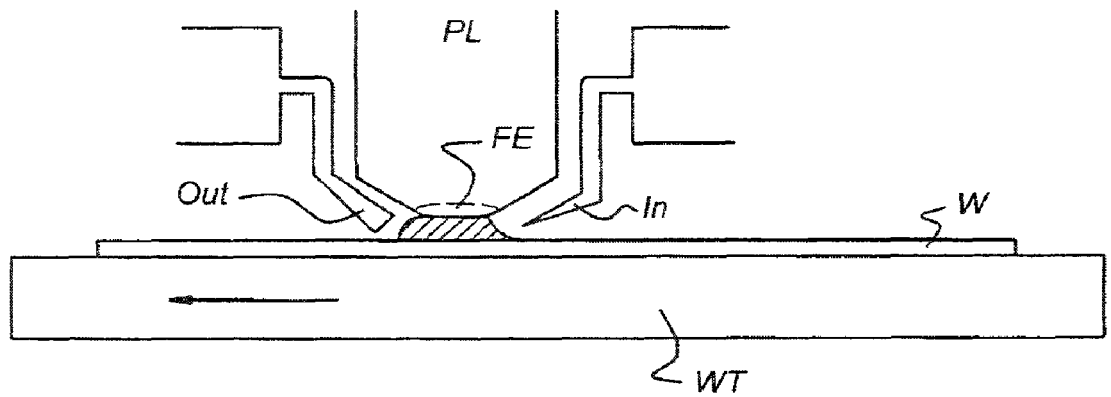
FIGS. 2 and 3 depict a liquid supply system used in a prior art lithographic projection apparatus.
Figure 3:
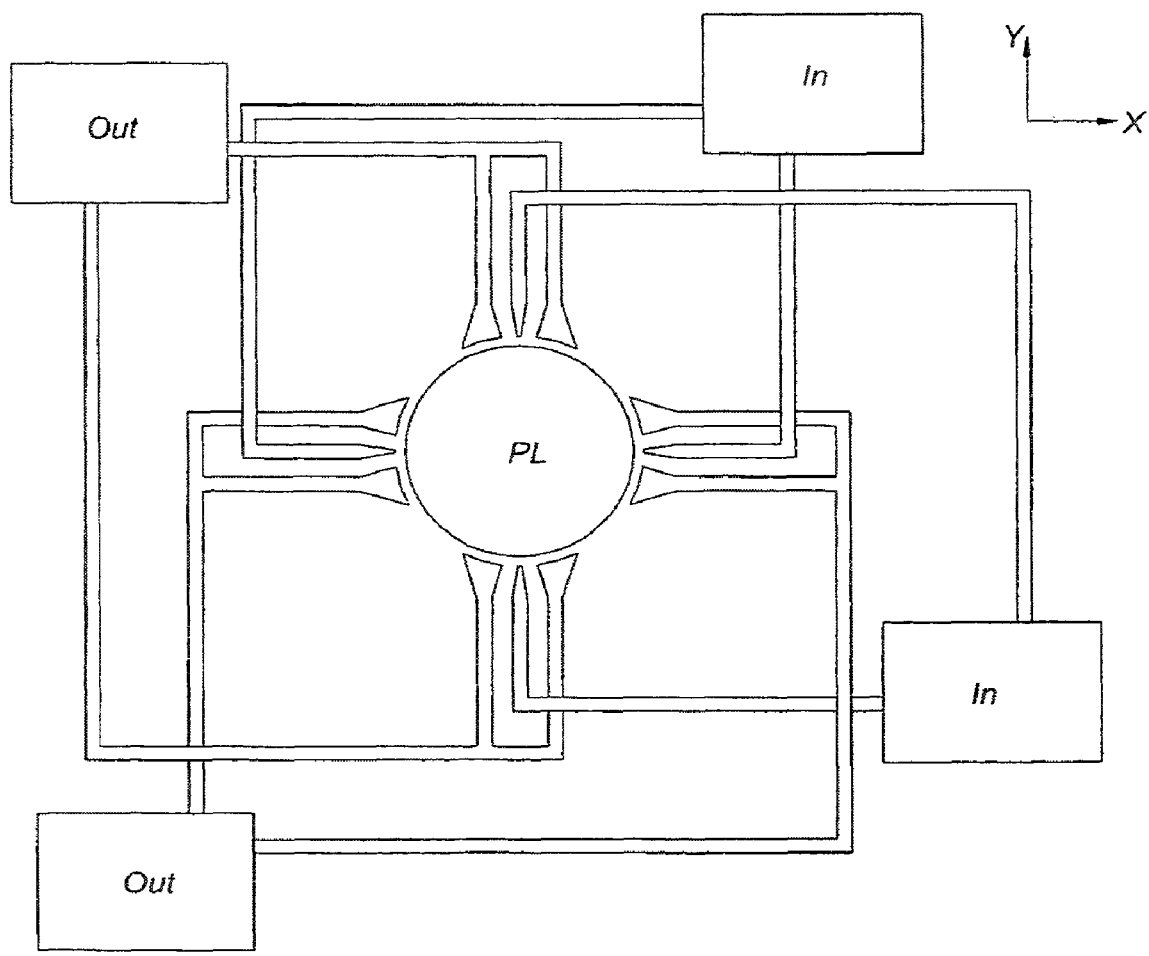

Different solutions are known to provide a lithographic apparatus using immersion techniques. A known system for providing a liquid is to use a system to provide liquid on only a localized area of the substrate W and in between a final element FE of the projection system PL and the substrate W using a liquid confinement system (the substrate W generally has a larger surface area than the final element of the projection system PL). One known way to arrange for this is illustrated in FIGS. 2 and 3, in which liquid is supplied by at least one inlet IN onto the substrate W, preferably along the direction of movement of the substrate W relative to the final element FE, and is removed by at least one outlet OUT after having passed under the projection system PL. That is, as the substrate W is scanned beneath the element in a –X direction, liquid is supplied at the +X side of the element and taken up at the –X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible. One example is illustrated in FIG. 3 in which four sets of an inlet with an outlet on either side are provided in a regular pattern around the final element.

Another solution which has been proposed is to provide the liquid supply system with a seal member which extends along at least a part of a boundary of the space between the final element of the projection system and the substrate table. Such a solution is illustrated in FIG. 4. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal.

According to U.S. patent application Ser. No. 10/959,403, liquid 11 is pumped into one side of the apparatus and out of the other side of the apparatus. As is depicted in FIG. 5, a reservoir 10 forms a contactless seal to the substrate W around the image field of the projection system PL so that liquid 11 is confined to fill a space between the substrate surface and the final element FE of the projection system PL. The reservoir 10 is formed by a seal member 12 positioned below and surrounding the final element FE of the projection system PL. Liquid 11 is brought into the space below the projection system PL and within the seal member 12. The seal member 12 extends a little above the final element FE of the projection system PL and the liquid level rises above the final element FE so that a buffer of liquid is provided. The seal member 12 has an inner periphery that at the upper end preferably closely conforms to the shape of the projection system PL or the final element FE thereof and may, e.g., be round. At the bottom, the inner periphery closely conforms to the shape of the image field, e.g., which is rectangular though this need not be the case.

The liquid 11 is confined in the reservoir 10 by a gas seal 16 between the bottom of the seal member 12 and the surface of the substrate W. The gas seal 16 is formed by gas, e.g. air or synthetic air but preferably $N_2$ or another inert gas, provided under pressure via an inlet 15 to a gap between seal member 12 and substrate W and extracted via a first outlet 14. An overpressure on the gas inlet 15, a substantially vacuum level on the first outlet 14 and geometry of the gap are arranged so that there is a high-velocity gas flow inwards that confines the liquid.

Figure 6:
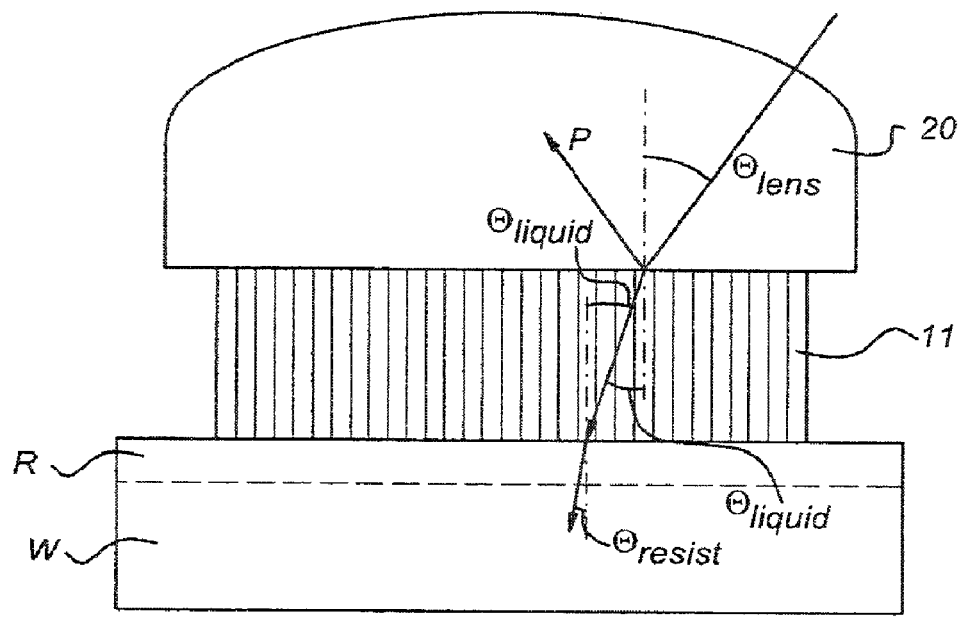
FIG. 6 depicts a final element of a projection system in a prior art lithographic projection system apparatus.

Turning to FIG. 6, the projection system PL comprises a final element 20. The final element 20 is most commonly a spherical lens, though it could be another element such as a diffractive or refractive element. The liquid 11 is supplied between this final element 20 and the substrate W. FIG. 6 shows the element 20 as used in prior art lithographic apparatus. It is a planar convex lens.

For all optical rays, there is what is known as a sine-condition:

$$n_{resist} \sin \theta_{resist} = n_{liquid} \sin \theta_{liquid} = n_{lens} \sin \theta_{lens} \qquad (1)$$

where:
$n_{resist}$=refractive index of a resist layer R provided on the substrate,
$n_{liquid}$=refractive index of the liquid 11,
$n_{lens}$=refractive index of the lens,
$\theta_{lens}$=angle between normal at lens-liquid boundary and radiation beam in the lens,
$\theta_{liquid}$=angle between normal at lens-liquid boundary and radiation beam in the liquid,
$\theta_{resist}$=angle between normal at liquid-resist boundary and radiation beam in the resist.

Note that formula (I) applies because the lens-liquid boundary and the liquid-resist boundary are substantially parallel. In other words, in order for an optical ray to pass unaffected through the final element FE (or lens 20 in this case), the liquid 11 and the resist layer R, this formula needs to balanced. This means that the lowest refractive index of the lens material, resist layer R or liquid limits the numerical aperture (NA) because:

$$NA = n_{lens} \sin \theta_{lens} \qquad (2)$$

If resists and liquids with a refractive index of greater than 1.56 are used, then the sine-condition can not be met at the lens-liquid boundary and total internal reflection occurs as shown in FIG. 6 with an arrow P. In order to solve this problem, the normal on the surface of the lens-liquid boundary is tilted by using a curved (concave) lens element 21. This enables a numerical aperture not to be limited by the refractive index of the lens material, but by the curvature of the lens surface.

In other words, because the refractive index ($n_{lens}$) is very difficult to increase, it is the $\sin \theta_{lens}$ which must be adjusted in order to balance formula (1).

Figure 7:
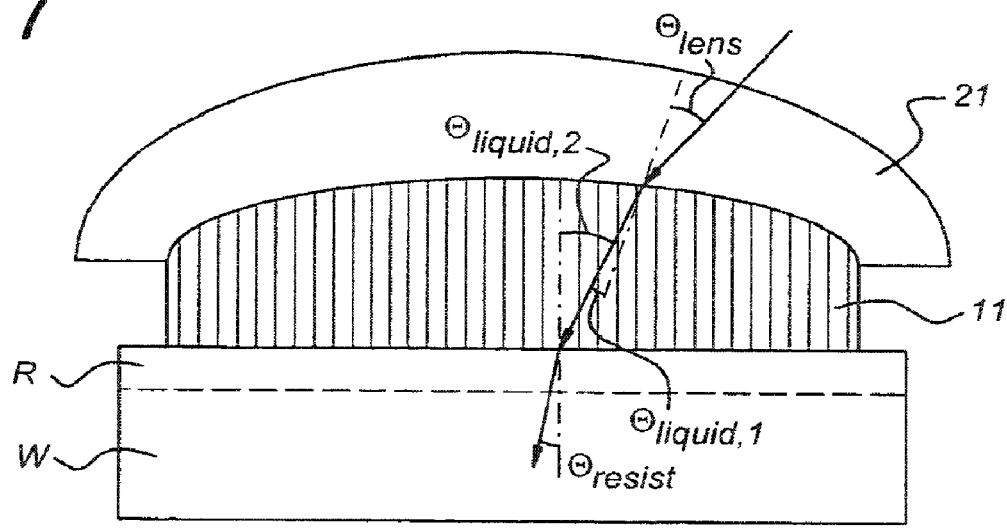
FIG. 7 depicts an alternative final element of a projection system according to a prior art lithographic projection apparatus.

Tilting the lens-liquid boundary is achieved by using a lens 21 which has a convex face facing the incoming projected patterned beam and a concave face facing the outgoing projected patterned beam. This may, for instance, be a meniscus convex lens which has a positive radius of curvature at both of its opposing faces. By "positive" radius of curvature it is meant that if light were entering from the left, the lens face would be bulging towards the left. If both faces have a positive radius of curvature, the lens would be convex on the left and concave on the right. Looking at FIG. 7, the light is coming from the top of the page and so the lens bulges towards the top of the page.

Again, the sine-condition applies:

$$n_{liquid} \sin \theta_{liquid,1} = n_{lens} \sin \theta_{lens} \qquad (3)$$

and $$n_{liquid} \sin \theta_{liquid,2} = n_{resist} \sin \theta_{resist} \qquad (4)$$

where:
$n_{resist}$=refractive index of the resist provided on the substrate,
$n_{liquid}$=refractive index of the liquid 11,
$n_{lens}$=refractive index of the lens,
$\theta_{lens}$=angle between normal at lens-liquid boundary and radiation beam in the lens,
$\theta_{liquid,1}$=angle between normal at lens-liquid boundary and radiation beam in the liquid, $\theta_{liquid,2}$=angle between normal at liquid-resist boundary and radiation beam in the liquid, $\theta_{resist}$=angle between normal at liquid-resist boundary and radiation beam in the resist.

The use of liquids with a refractive index which is as high as possible and therefore higher than that of the lens improves the resolution of the pattern image on the substrate W.

To fully exploit the imaging properties in the future, immersion systems are needed with a liquid 11 having a high refractive index ($n_{liquid}$>1,6), and curved (concave) lens elements 21 will be used as final elements FE. However, when filling the space between the substrate W and the curved (concave) lens element 21 with an immersion liquid, gas entrapment may occur.

The space in between the substrate W and the last lens element, formed by a curved (concave) lens element 21, is filled with a liquid as described above with respect to the prior art. During the filling, for instance before initial use of the system, a liquid surface level will rise from bottom to top. As a result, gas or air may be entrapped between the rising liquid surface level and the curved (concave) lens element 21. This is schematically depicted in FIG. 8.

Figure 8:
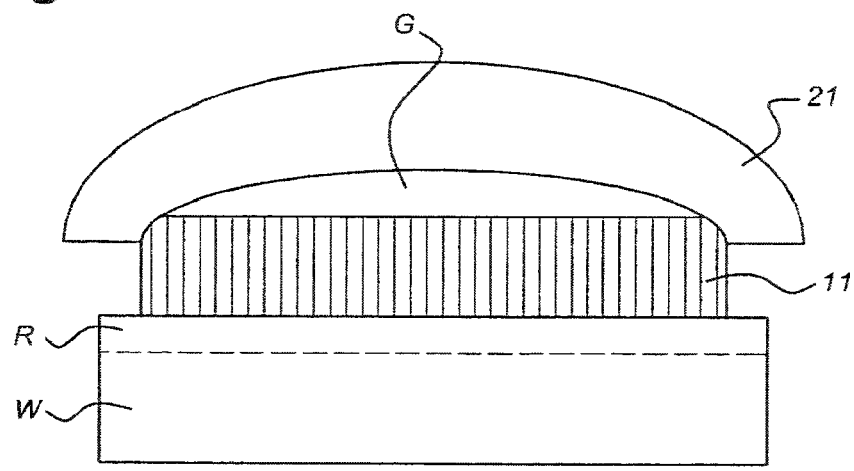
FIG. 8 depicts a final element of a projection system together with a gas entrapment according to an embodiment of the invention.

FIG. 8 depicts a substrate W that may have a layer of resist R provided on it. Further depicted is the last lens element 21 of the projection system PL, the curved (concave) lens element 21. The hardware for providing the immersion liquid 11, removing the liquid 11 and keeping the liquid 11 confined, as described above, are not depicted in FIG. 8. FIG. 8 shows a gas entrapment G (or air pocket) in between the surface level of the immersion liquid 11 and the lens element 21.

Such a gas entrapment G will negatively influence the imaging quality of the lithographic apparatus, as it changes the optical characteristics of the lithographic apparatus in a negative and unpredictable way.

Therefore, a number of embodiments are described for minimizing undesired gas entrapment G under the curved (concave) lens element 21.

Figure 9A:
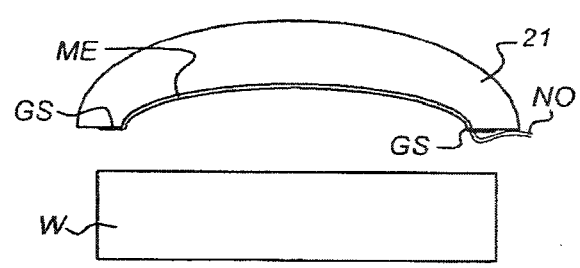
FIGS. 9a-d depict a lens element according to an embodiment.
Figure 10A:
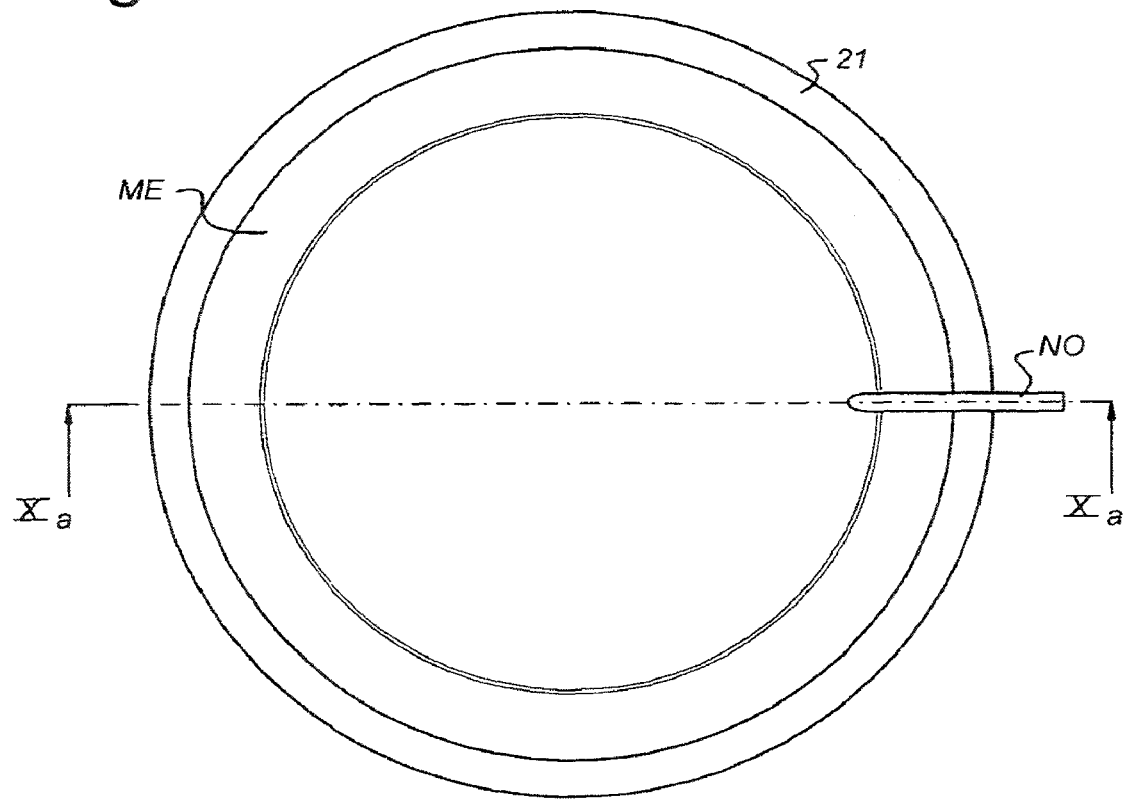
FIGS. 10a and 10b depict a membrane according to an embodiment.

According to an embodiment, the curved (concave) lens element 21 comprises a membrane ME that is connected to the concave side of lens element 21. FIG. 9a shows a side view of such a lens element 21 comprising membrane ME. FIG. 10a depicts a bottom view of such a lens element 21. In an embodiment, membrane ME is connected to the lens element 21 along the circumference of the membrane ME, as is shown in FIGS. 9a and 10a. The connection between the membrane ME and the lens element 21 may be formed in any suitable way, for instance by a connection seam, e.g. a glued seam GS.

It will be understood that the membrane ME is attached to the lens element 21 in such a way that the connection seam (glued seam GS) is outside the imaging area of the lens element 21.

Gluing is a known technique used to fix a pellicle to a reticle mount, mask MA or mask table MT. The lower surface of such a pellicle, i.e. the surface opposite to the surface to which the pellicle is adhesively bonded, is usually coated with a pressure-sensitive adhesive based on a polybutene resin, polyvinyl acetate resin, acrylic resin or the like in order to facilitate mounting of the pellicle. U.S. Pat. No. 5,378,514 discloses the use of a hot-melt adhesive. Similar gluing techniques may be used for attaching the membrane ME to the lens element 21, or gluing different membrane layers together, as will be described in more detail below, for instance with reference to FIG. 13.

Figure 10B:

FIG. 10b depicts a side view of membrane ME, before it is connected to lens element 21. FIG. 10b depicts a nozzle NO.

At the edges of the membrane ME glue for glued seam GS may be provided to allow easy connection of the membrane ME to the lens element 21.

The membrane ME may be made of any suitable material. The membrane ME may for instance be made of a pellicle material. For instance, the membrane ME may be made of fluoropolymers, such as TEFLON AF (trademark of DuPont), or CYTOP (trademark of Asahi Glass Company). The use of pellicle material is described in 'Principles of lithography' by Harry J. Levinson, published by SPIE—The international Society for Optical Engineering (ISBN 0-8194-4045-0).

Optionally an AR (anti-reflection) coating is used on the membrane ME, such as metal oxides or fluorides.

The index of the membrane ME may be optimized to be close to the index of the liquid ($n_{membrane}$=$n_{liquid}$±0,3).

The membrane ME may have a thickness of about 250 nm-2 μm, depending on the circumstances. It should be appreciated that the thickness as selected is a trade off between mechanical strength and absorption/aberration.

The refractive index is approximately 1.34 for CYTOP and approximately 1.31 for Teflon AF. The exact value of the refractive index depends on the exact composition of the material and the manufacturing process and it is mentioned in the literature that the refractive index can be varied. The refractive index of the material of membrane ME can be chosen to match with the refractive index of the immersion liquid 11, which for instance is 1.33, to minimize disturbance of the beam PB by the membrane ME as a result of refraction.

A high refractive index may be chosen of approximately 1.6. In case the membrane is thin enough, e.g. 10 μm, the resulting aberration is limited.

Along the circumference of the membrane ME nozzle NO is provided. This nozzle NO may be an inlet nozzle NO for providing liquid, but may also be used as an outlet nozzle for removing at least one of liquid, gas and air. The nozzle NO may be connected to appropriate liquid supplies, pumps etc.

FIG. 9a depicts the initial configuration of the lens element 21 and the membrane ME before liquid is provided. The membrane ME sticks to the lens element 21. This may be the result of adhesion forces in between the membrane ME and the lens element 21. Also, the membrane ME may be sucked against the lens element 21 as a result of underpressure or vacuum in between the membrane ME and the lens element 21.

Figure 9B:
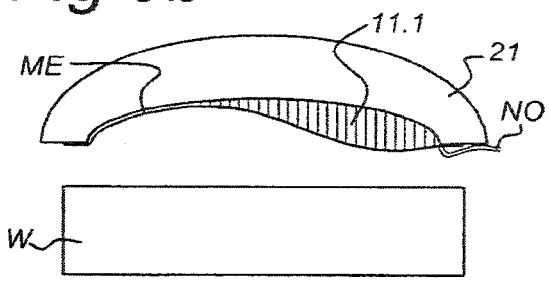
Figure 9C:
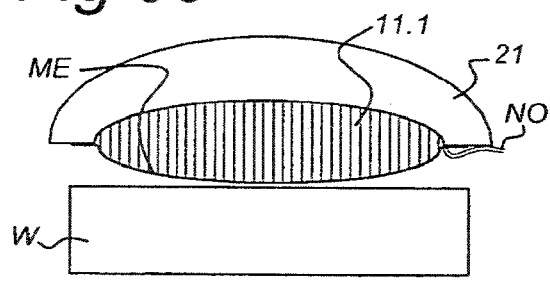
Figure 9D:
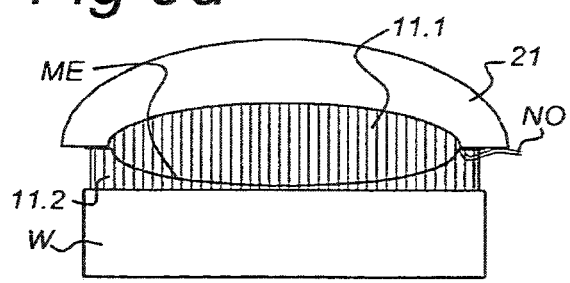

In a first action, liquid 11.1 is supplied through nozzle NO to fill the space in between the lens element 21 and the membrane ME. FIGS. 9b and 9c show respective phases of the filling process. FIG. 9b shows the phase in which part of the membrane ME is filled with liquid 11.1. FIG. 9c shows the phase in which the membrane ME is totally filled with liquid 11.1.

In a second action, the remaining space in between the membrane ME and the substrate W or substrate table WT is filled with liquid 11.2 using filling techniques and devices known to a skilled person, and of which some examples have been discussed above with respect to the prior art.

As a result of the filling process as shown in FIGS. 9a-d, the total space in between the substrate W or substrate table WT and the lens element 21 is filled with liquid 11.1, 11.2, without a gas entrapment G.

The membrane ME may be very thin in order to minimize absorption and/or aberrations of the radiation beam B. In order to reduce the stress on the membrane ME and/or to reduce the mechanical force on the connection between the membrane ME and the lens element 21, an alternative filling process may be employed.

Figure 11A:
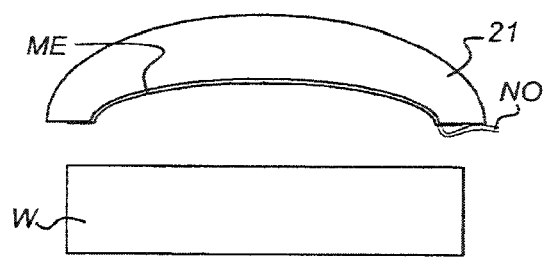
FIGS. 11a-f depict a lens element according to a further embodiment.
Figure 11B:
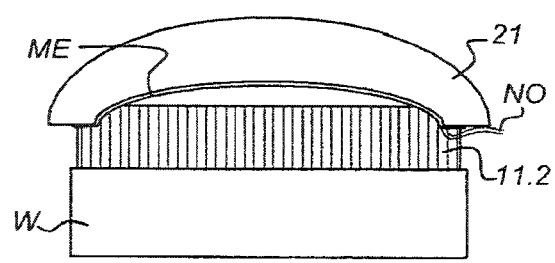

According to the alternative, again, the filling process starts with the membrane ME stuck against the lens element 21, as depicted in FIG. 11a. Then, the space in between the substrate W (or substrate table WT) and the membrane ME is filled with liquid 11.2 using filling techniques and devices known to a skilled person, and of which some examples have been discussed above with respect to the prior art. This is depicted in FIG. 11b. When this is finished, a gas entrapment G will be present in between the membrane ME and the surface of the liquid 11.2, as is depicted in FIG. 11b.

Figure 11C:
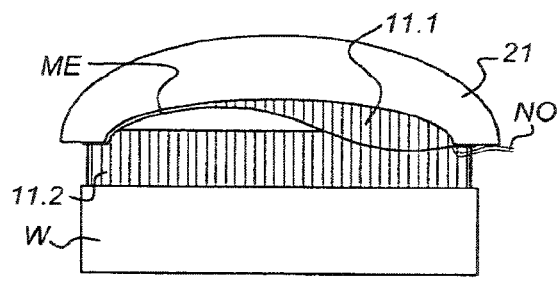

Next, liquid 11.1 is supplied via nozzle NO to fill the space in between the lens element 21 and the membrane ME. As a result, some of the liquid 11.2 in between the membrane ME and the substrate W or substrate table WT will be pushed out. This phase is depicted in FIG. 11c.

Figure 11D:
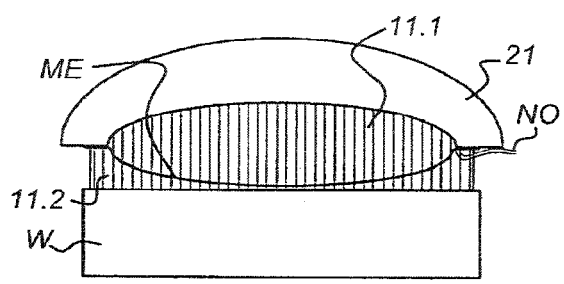

Also, the gas entrapment G will be pushed out by the liquid 11.1, leaving the total space in between the lens element 21 and the substrate W or substrate table WT filled with liquid, without a gas entrapment G. This is depicted in FIG. 11d.

According to this alternative, the stress on the membrane ME and/or the mechanical force on the connection between the membrane ME and the lens element 21 is reduced, since during the filling process the pressure on both sides of the membrane ME is more balanced than in the filling process discussed with reference to FIGS. 9a-d. For instance, in the phase depicted in FIG. 9c, in which the total space in between the lens element 21 and the membrane ME is filled with liquid 11.1, while the space in between the membrane ME and the substrate W or substrate table WT is empty, the stress on the membrane ME and/or to the mechanical force on the connection between the membrane ME and the lens element 21 are relatively high. This is prevented in the alternative embodiment described with respect to FIGS. 11a-d.

Figure 11E:
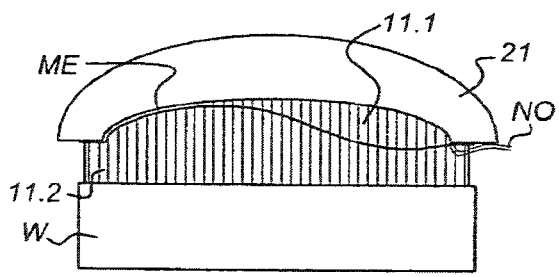
Figure 11F:
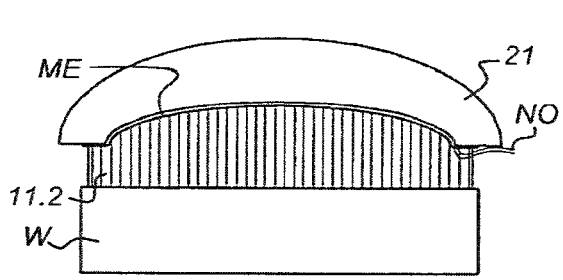

According to a further alternative, the stress on the membrane ME and/or the mechanical force on the connection between the membrane ME and the lens element 21 may be reduced by deflating the membrane ME after the filling process described with reference to FIGS. 11a-d. This may be done by pumping liquid 11.1 present in between the membrane ME and the lens element 21 after the filling process described with reference to FIGS. 11a-d out via nozzle NO and, simultaneously, pumping liquid 11.2 into the space between the membrane ME and the substrate W or substrate table WT, to replace the liquid that is pumped out. This is depicted in FIG. 11e. The membrane ME will stick to the lens element 21 again, as depicted in FIG. 11f.

As a result, the membrane ME is stuck to the lens element 21. This minimizes the mechanical disturbance of the lens element 21. Also, the membrane ME is moved further out of focus, reducing its influence on the imaging.

It should be appreciated that the actions depicted in FIG. 11e and 11f may also be employed after the embodiment described with reference to FIGS. 9a-d.

It should be appreciated that according to this variant, since the membrane is emptied, the membrane ME may be filled with a different liquid 11.1 than the space outside the membrane ME. In fact, the membrane ME may be filled with air or an appropriate gas.

The membrane ME may be relatively thin and may easily be damaged. Also, the membrane ME may be made of a material known from pellicles. Because of this, the membrane ME may degrade, for instance as a result of exposure to the radiation beam (e.g. ultraviolet, deep ultraviolet (DUV). If the membrane ME is attached to the lens element 21, replacement may be difficult and time consuming.

According to an alternative, a temporary membrane ME is used, which may be removed and replaced easily. In fact, the membrane ME may be removed after each filling process, before the first exposure, and is therefore not exposed to the beam PB. This alternative will be further explained with reference to FIGS. 12a-12g.

Figure 12A:
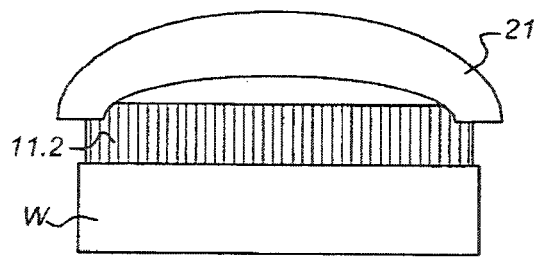
FIGS. 12a-g depict a lens element according to a further embodiment.
Figure 12B:
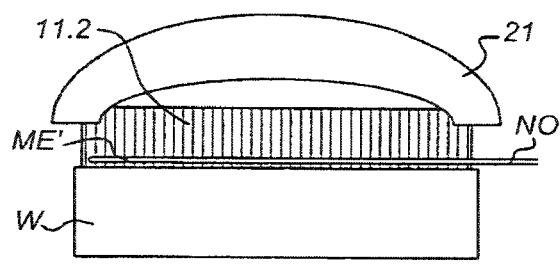

In a first action, the space in between the substrate W or substrate table WT and the lens element 21 is filled with liquid 11.2. This is depicted in FIG. 12a. During this action, no membrane ME is present. When this is finished, a gas entrapment G will be present in between the lens element 21 and the surface of the liquid 11.2, as is depicted in FIG. 12a.

In a next action, a membrane ME' is brought into the space in between the lens element 21 and the substrate W or substrate table WT. The membrane ME' is different from the membrane ME described above, as it is a double layer membrane ME', instead of a single layer membrane ME. This is further explained below with reference to FIG. 13.

Figure 12C:
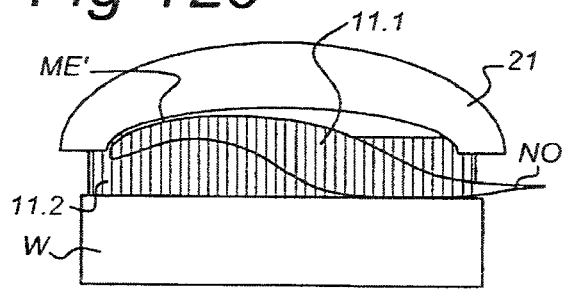

Next, the space in between the two layers of the membrane ME' is filled with liquid 11.1 using nozzle NO. As a result, part of the liquid 11.2 already present in between the lens element 21 and the substrate W or substrate table WT, as well as the gas entrapment G is pushed out. This is depicted in FIG. 12c.

Figure 12D:
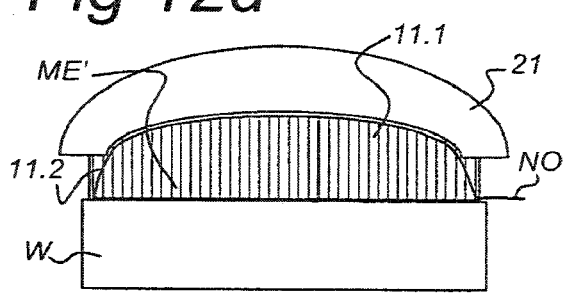

The membrane ME' is formed in such a way, that it will fill the complete space in between the lens element 21 and the substrate W or substrate table WT, or at least the concavity under the lens element 21. This ensures that the entire gas entrapment is pushed out. This is depicted in FIG. 12d.

Figure 12E:
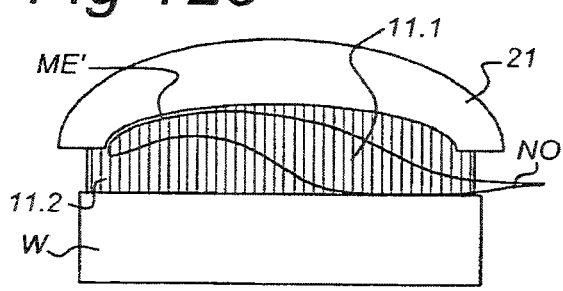
Figure 12F:
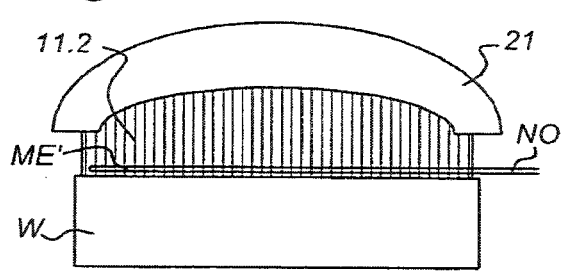
Figure 12G:
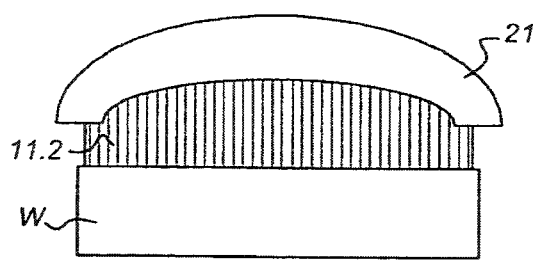

Optionally, in a next action, the liquid 11.1 inside the membrane ME' is pumped out of the membrane ME', until there is no liquid 11.1 present in it anymore. Simultaneously, the space in between the substrate W or substrate table WT and lens element 21 may be filled with liquid 11.2 to replace the liquid 11.1 that is pumped out of membrane ME'. These actions are depicted in FIGS. 12e and 12f.

Finally, the deflated membrane ME' may be removed (see FIG. 12g), for instance before exposure.

The alternative embodiment described with reference to FIGS. 12a-g provides a filling technique and membrane ME' that allows easy replacement. In fact, the membrane ME' may be removed before exposure, minimizing degrading of the membrane ME' as a result of the exposure. Removal of the membrane ME' before exposure, ensures that the membrane ME' has no negative influence on the imaging process, for instance as a result of refraction.

It will be understood that according to this variant, since the membrane ME' is emptied, the membrane ME' may be filled with a different liquid 11.1 than the space outside the membrane ME'. In fact, the membrane ME' may be filled with air or an appropriate gas.

Figure 13:
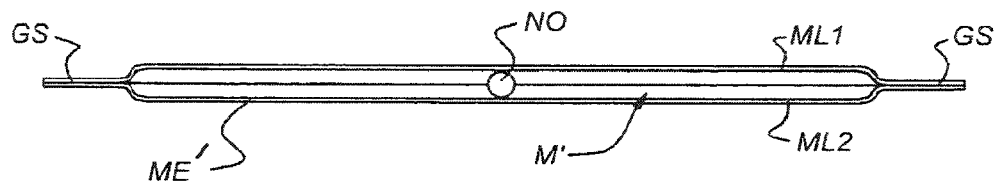
FIG. 13 depicts a membrane according to a further embodiment.

FIG. 13 depicts a side view of a double layer membrane ME'. The membrane ME' comprises a first membrane layer ML1 and a second membrane layer ML2 that are glued together at their circumference, for instance by a glue seam GS. FIG. 13 further depicts nozzle NO. For the membrane ME', the same materials may be used as for the single layer membrane ME described with reference to FIG. 10b.

Figure 14A:
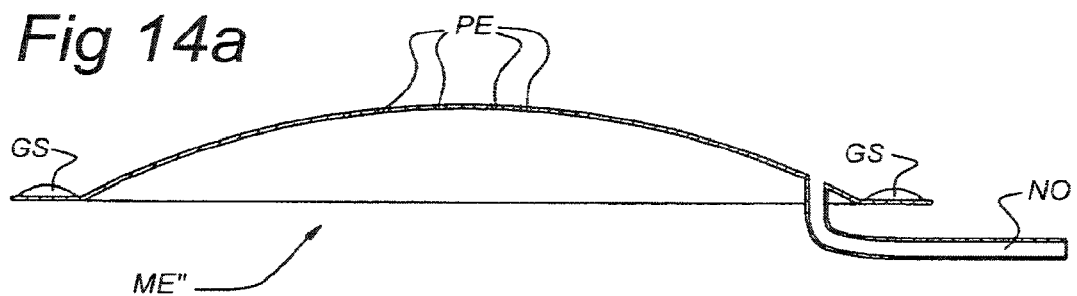
FIGS. 14a-h depict a lens element according to a further embodiment.
Figure 14B:
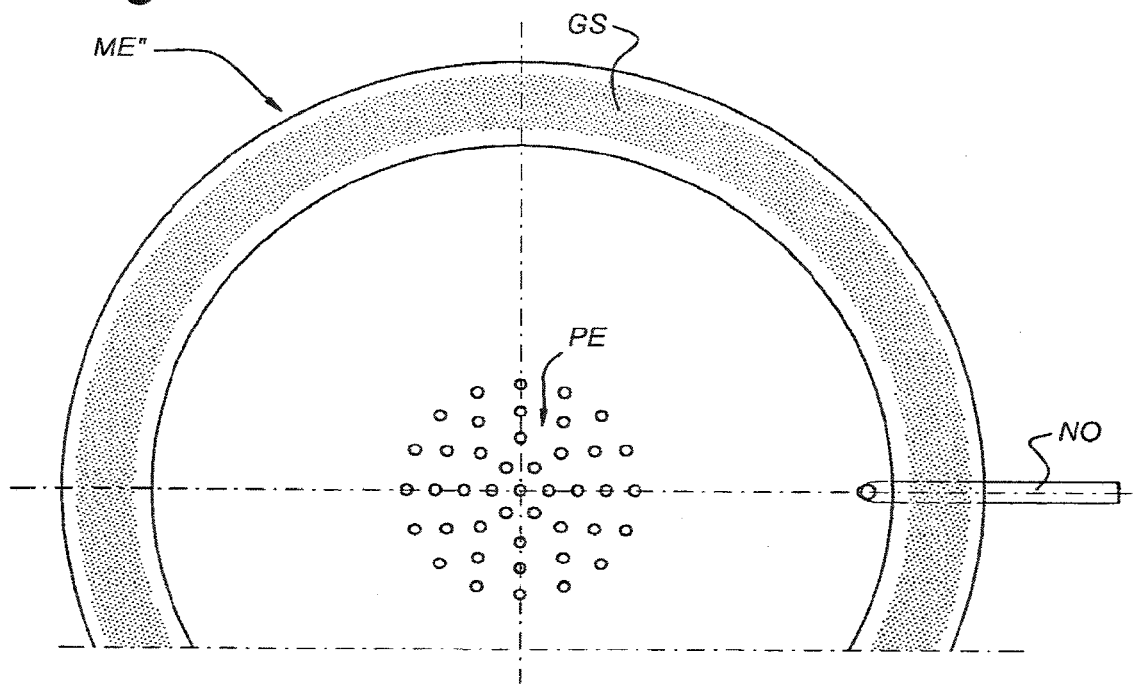

According to a further alternative embodiment, the membrane may be a substantially rigid membrane ME", having a rigid shape corresponding to the shape of the concavity of the lens element 21. The membrane ME" may further comprise perforations PE, as depicted in FIGS. 14a and 14b, depicting a side view and a top view respectively. The membrane ME" may further comprise a nozzle NO, arranged to be connected to an appropriate pump, or the like.

Figure 14C:
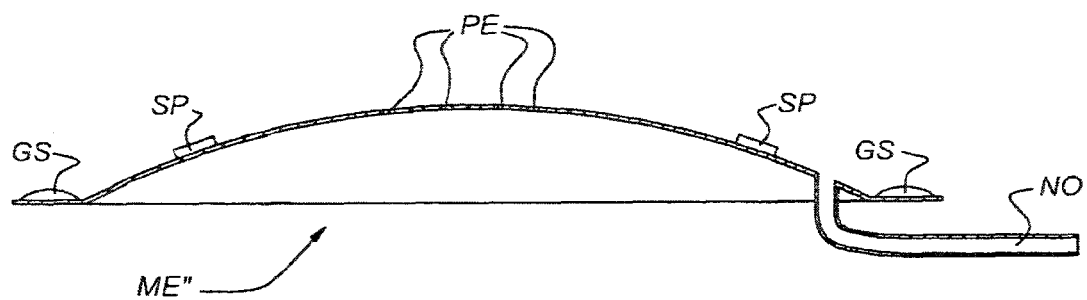
Figure 14D:
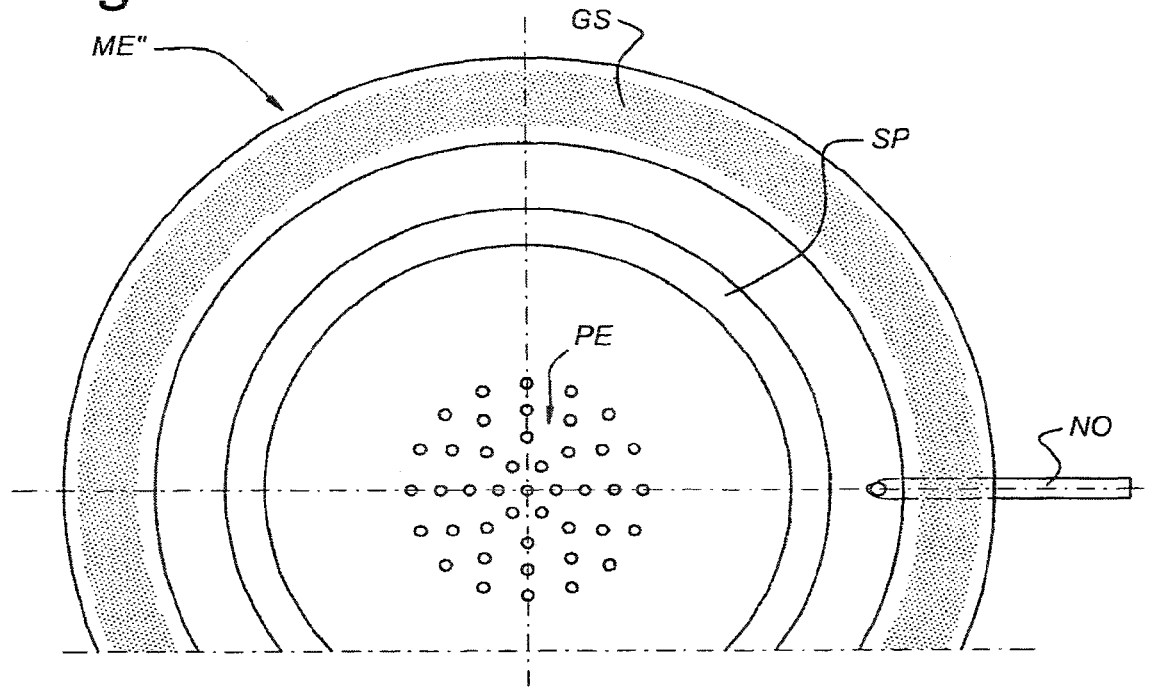
Figure 14E:
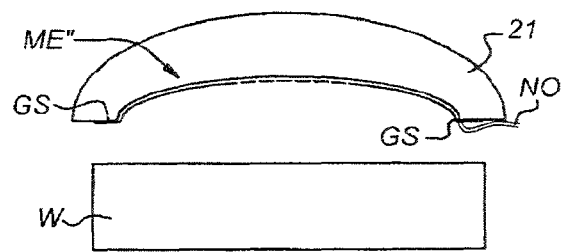

The membrane ME" may further comprise a glue seam GS, for connecting the membrane ME" to the lens element 21, as shown in FIG. 14e.

FIGS. 14e, f and g show respective actions for filling the space in between the lens element 21 and the substrate W or substrate table WT. In a first action, the membrane ME" is positioned such that it is relatively close to the surface of the lens element 21 facing the substrate W or substrate table WT. In between lens element 21 and the membrane ME" is a small opening. This is depicted in FIG. 14e.

Figure 14F:
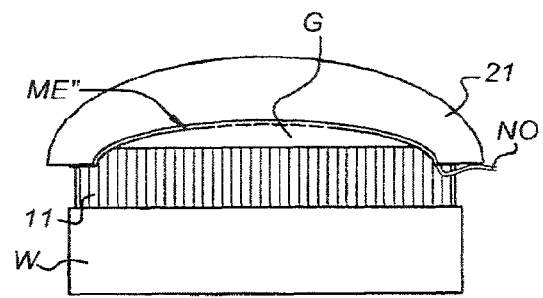

Next, the space under the lens element 21 is filled with liquid 11. This is depicted in FIG. 14f. The filling results in a gas entrapment G present, as also shown in FIG. 14f.

Figure 14G:
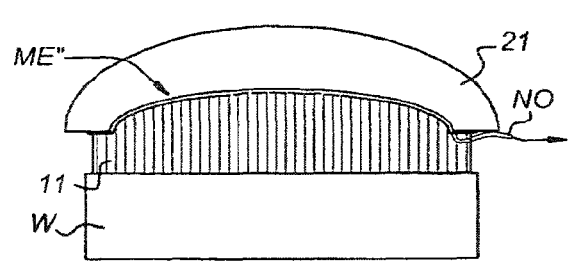
Figure 14H:
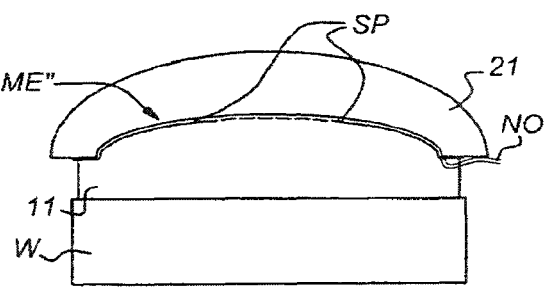

Then, the gas entrapment G is extracted via nozzle NO, as shown in FIG. 14g. Liquid 11 may flow through the perforations PE to replace the gas entrapment G. During this, it may be necessary to add extra liquid 11 to replace the gas entrapment G. This finally results in the space in between the lens element 21 and the substrate W or substrate table WT being completely filled with liquid, without a gas entrapment G.

According to a further variant, the membrane ME" may comprise at least one spacer SP, as shown in FIGS. 14c and 14d depicting a side view and a top view respectively. The spacer SP prevents the membrane ME" from being sucked against the lens element 21 during gas extraction. The spacers SP may be made of the same material as the membrane ME" and may for instance be made of pellicle material as described above.

The membrane ME" may be rigid for instance by making it thicker and/or spacers SP may be added, so that it does not collapse during gas extraction. The membrane ME" then keeps the same curvature as the curved lens element. By using perforations, the gas/air may be extracted until the area fills with liquid.

The size, shape and distribution of the perforations PE may be varied to vary the effectiveness of the extraction of the gas. If pieces of the spacer SP are used they may also be varied in size shape and distribution.

The material of the spacers SP and membrane ME" may be chosen such that their refractive index is equal to that of the liquid, to minimize disturbance of the beam PB.

According to a further embodiment, the gas entrapment G as it may develop when filling the space between the last lens element 21 and the substrate W or substrate table WT may be removed by introducing a tube TU. One end of the tube TU may be positioned in the gas entrapment G, while the other end is connected to an appropriate suction device, such as a pump PU. The pump PU may then be turned on, sucking the gas out of the gas entrapment G. When all gas is sucked out of the gas entrapment G, the tube TU and the pump PU will start sucking liquid. In a next action, the tube TU is removed.

Figure 15A:
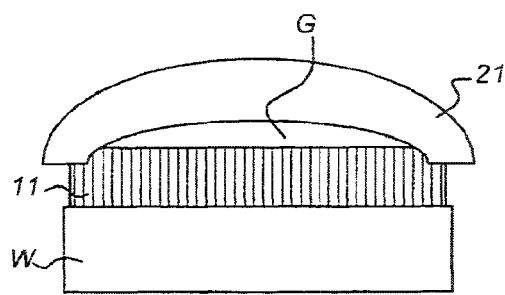
FIGS. 15a-g depict a lens element according to a further embodiment.

In a first action, the space in between the substrate W or substrate table WT and the membrane ME is filled with liquid 11. This is depicted in FIG. 15a. When this is finished, a gas entrapment G will be present in between the membrane ME and the surface of the liquid 11.

Figure 15B:
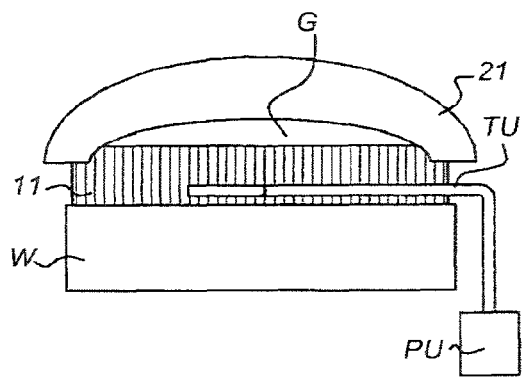
Figure 15C:
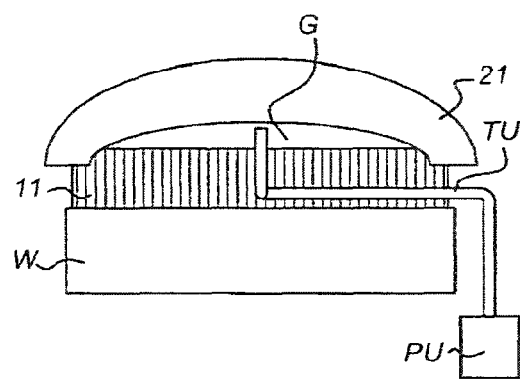

In a further action, the tube TU is introduced in the space in between the substrate W or substrate table WT and the lens element 21. The end of the tube TU is positioned such that it is in the gas entrapment G. The end of the tube TU may be positioned as high as possible in the gas entrapment G. The end of the tube TU may be positioned against the lens element 21 or at a small distance from it, to prevent damaging the lens element 21. This is depicted in FIGS. 15b and 15c. The tube TU may (partially) be made of Teflon.

In order to position the tube TU, it may be provided with joints, extendable parts, etc. The other end of the tube TU is connected to the pump PU.

Figure 15D:
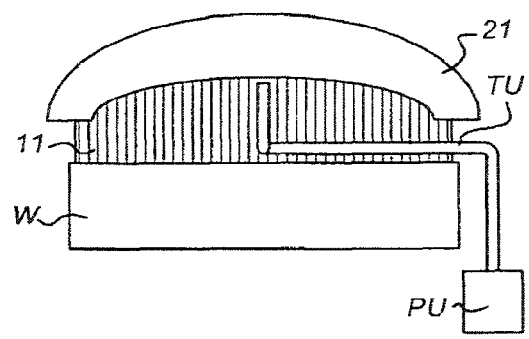

In a further action, the pump PU sucks the gas out of the gas entrapment G, as a result of which the liquid surface level will rise. The pump PU may possibly also suck liquid 11 once the gas entrapment G has disappeared. This is shown in FIG. 15d.

Figure 15E:
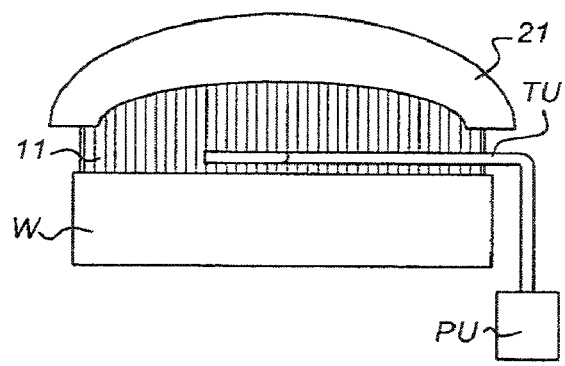
Figure 15F:
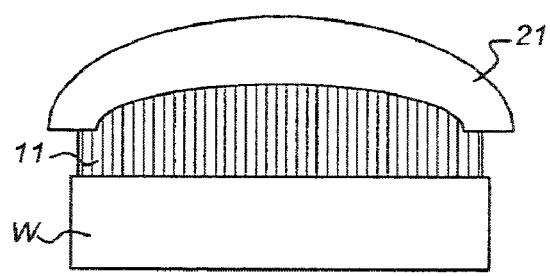

In a final action, the tube TU is removed again, as depicted in FIGS. 15e and 15f, leaving the space in between the lens element 21 and the substrate W or substrate table WT completely filled with liquid 11.

Figure 15G:
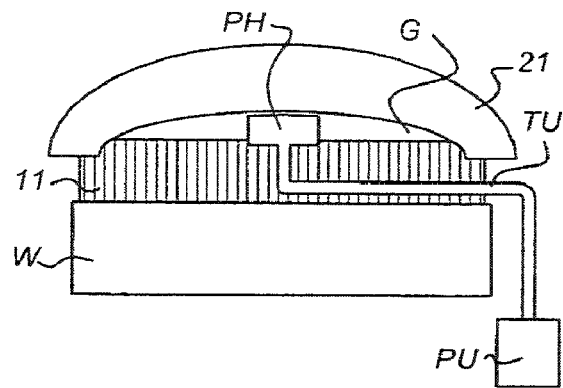

According to a variant, the tube TU may be provided with a probe head PH, see FIG. 15g. The probe head PH may be formed to match the shape of the concave surface of the lens element 21. This ensures that the gas entrapment G is sucked out efficiently.

The probe head PH may (partially) be made of Teflon.

Figure 15H:
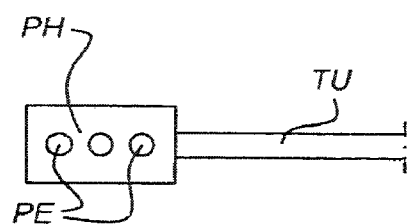
FIG. 15h depicts a probe head according to an embodiment.

The part of the probe head PH matching the concave surface of the lens element 21 may be provided with a number of perforations PE. This is schematically depicted in FIG. 15h, showing a top view of the probe head PH. It should be appreciated that the probe head PH may have any suitable shape and number of perforations PE.

According to a variant, pump PU may be used to pump liquid or air towards the lens element 21, instead of being used as a suction device to pump air or liquid from the lens element 21. This may be done with the tube TU with or without the probe head PH. The tube TU and the pump PU may then be used as a 'sprinkler' to clean lens element 21.

For instance, if there is a drying stain on the lens element 21, for instance as a result of prior use in combination with immersion techniques, the pump PU may use a cleaning solution different to the immersion liquid 11 to remove the drying stain.

Cleaning of the lens element 21 may be applied on an immersed lens element 21 (liquid 11 is present), or may be applied on a dry lens element 21. The tube TU and the pump PU may also be used to introduce air or gas, for instance dry and/or warm air/gas, for drying the lens element 21 after cleaning or immersion.

Figure 16A:
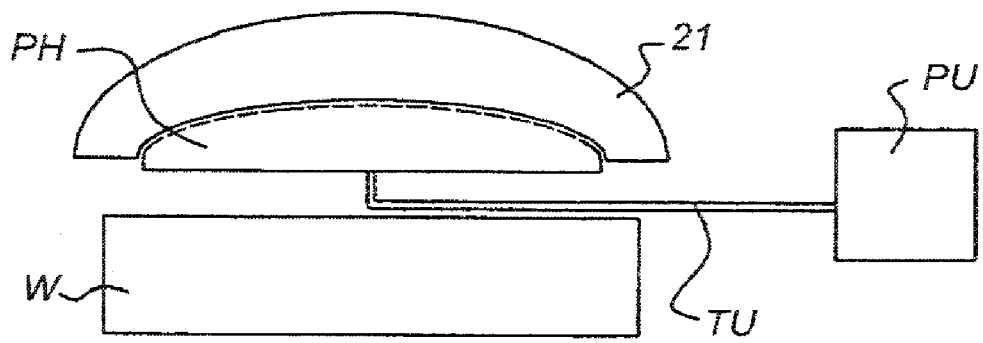
FIGS. 16a and c depict further embodiments.
Figure 16B:
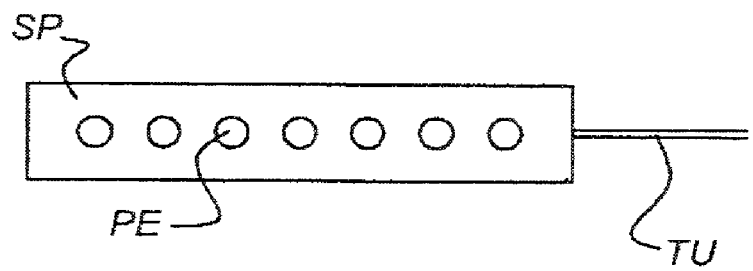
FIG. 16b depicts a probe head according to an embodiment.

In case the tube TU is provided with a probe head PH, the probe head PH may be formed as the probe head PH depicted in FIGS. 15g and 15h. According to an alternative, the probe head PH is formed as depicted in FIGS. 16a and 16b. According to this variant, the probe head PH is formed to follow the concave surface of the lens element 21, to ensure proper cleaning of the imaging surface of the lens element 21.

The cleaning procedure may comprise a first action of inserting the tube TU and probe head PH and positioning it with respect to lens element 21. In a next action, the cleaning may be carried out by spraying the lens element 21 with a cleaning liquid. The cleaning action may further comprise further spraying the lens element 21 with a rinsing agent, such as water. The cleaning action may further comprise spraying the lens element 21 with a rinsing agent, such as acetone. After this, the cleaning action may comprise drying the lens surface by introducing gas or air, for instance dry and/or warm air/gas. In a final action, the tube TU and probe head PH may be removed.

According to a variant, the cleaning procedure may be performed on a 'wet' lens element, i.e. in a situation in which the space under the lens is filled with immersion liquid 11. The liquid 11 may be applied in any suitable way, for instance according to any one of the filling techniques described in this document.

In a next action, the tube TU and the probe head PH are positioned as explained above. In case tube TU and possibly probe head PH is still positioned as a result of a previous filling procedure, the tube TU and probe PH already in position may be used for the cleaning procedure. However, the tube TU and probe head PH may also be replaced with an other tube TU and/or probe head PH.

In a further action, the lens element 21 is sprayed with a cleaning liquid, or a subsequent combination of cleaning liquids. When this is done, the liquid 11 present under the lens element 21 may be refreshed. Once the cleaning is finished, the lens element 21 may be sprayed with immersion liquid 11 via tube TU and possibly probe head PH, while the already present immersion liquid 11 is refreshed. This is done until the concentration of cleaning liquid in the immersion liquid 11 is below a particular concentration. In a final action, the tube TU and the probe head PH are removed.

Figure 16C:
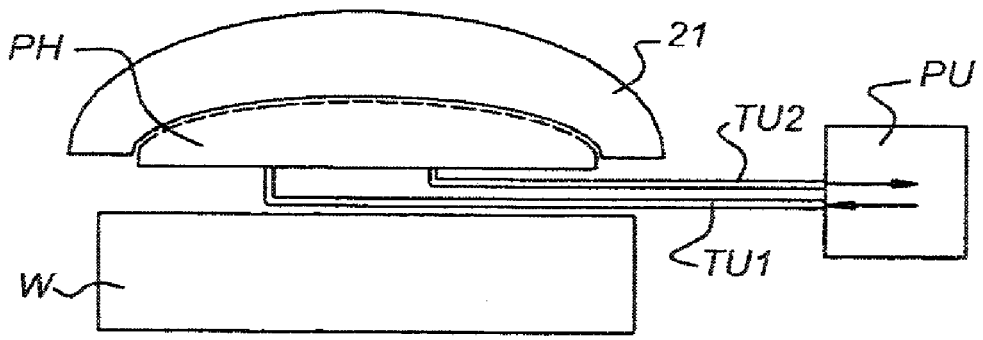

According to a further variant, two tubes TU are provided, where a first tube TU1 is used to provide cleaning liquid to the lens element 21 and a second tube TU2 is used to remove liquid from the lens element 21. Both tubes TU1, TU2 may be connected to an appropriate pump PU. This is depicted in FIG. 16c.

By simultaneously spraying and extracting liquid, a flow along the surface of lens element 21 is provided, improving the cleaning procedure.

Figure 17A:
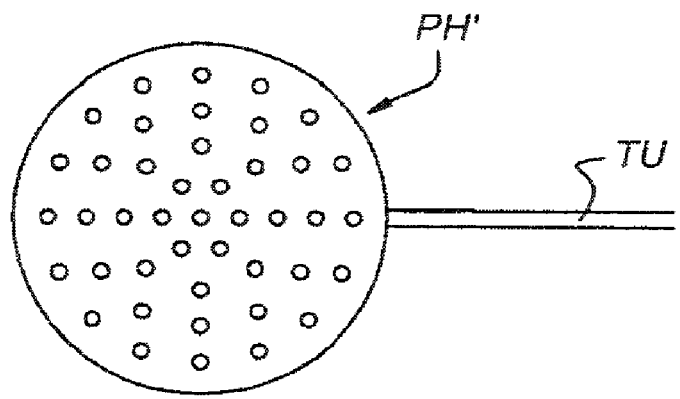
FIGS. 17a-d depict probe heads according to further embodiments.

It should be appreciated that the probe head PH may be given any suitable shape. FIG. 17a, e.g. shows a probe head PH' that is disc-shaped to increase the cleaning of the entire lens element 21. FIG. 17a depicts a top view of such a probe head PH' comprising a plurality of perforations PE.

Figure 17B:
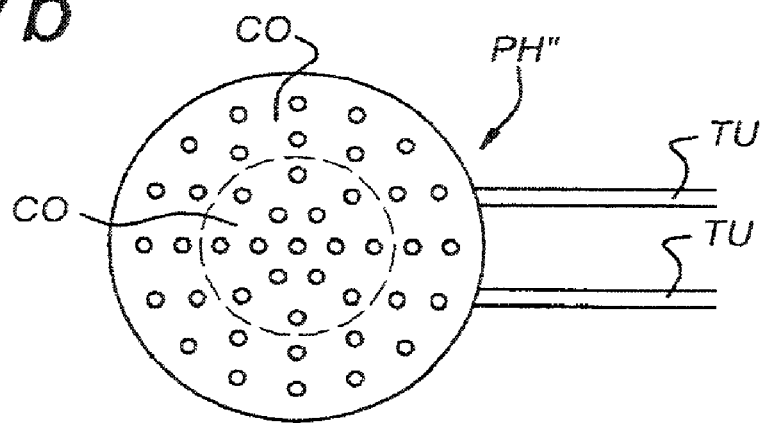

FIG. 17b shows an alternative probe head PH". The probe head PH" may comprise two or more compartments CO, that each may have there own tube TU connected to it. FIG. 17b depicts a top view of probe head PH" with two compartments CO and two tubes TU. Providing a probe head PH with two or more compartments CO ensures a proper flow of cleaning liquid to the entire surface of lens element 21.

The probe head PH may be given any alternative shape, for instance corresponding to the surface of the lens element 21. The probe head PH may also be used to clean lens elements 21 having a more or less concave shape or even a flat or convex shape.

Figure 17C:
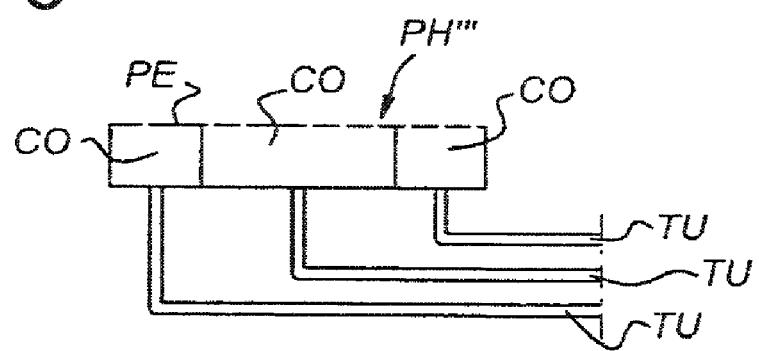

FIG. 17c depicts a side view of probe head PH''', having a substantially flat shape. The probe head PH''' further comprises three compartments CO, each having their own tube TU connected to it.

Figure 17D:
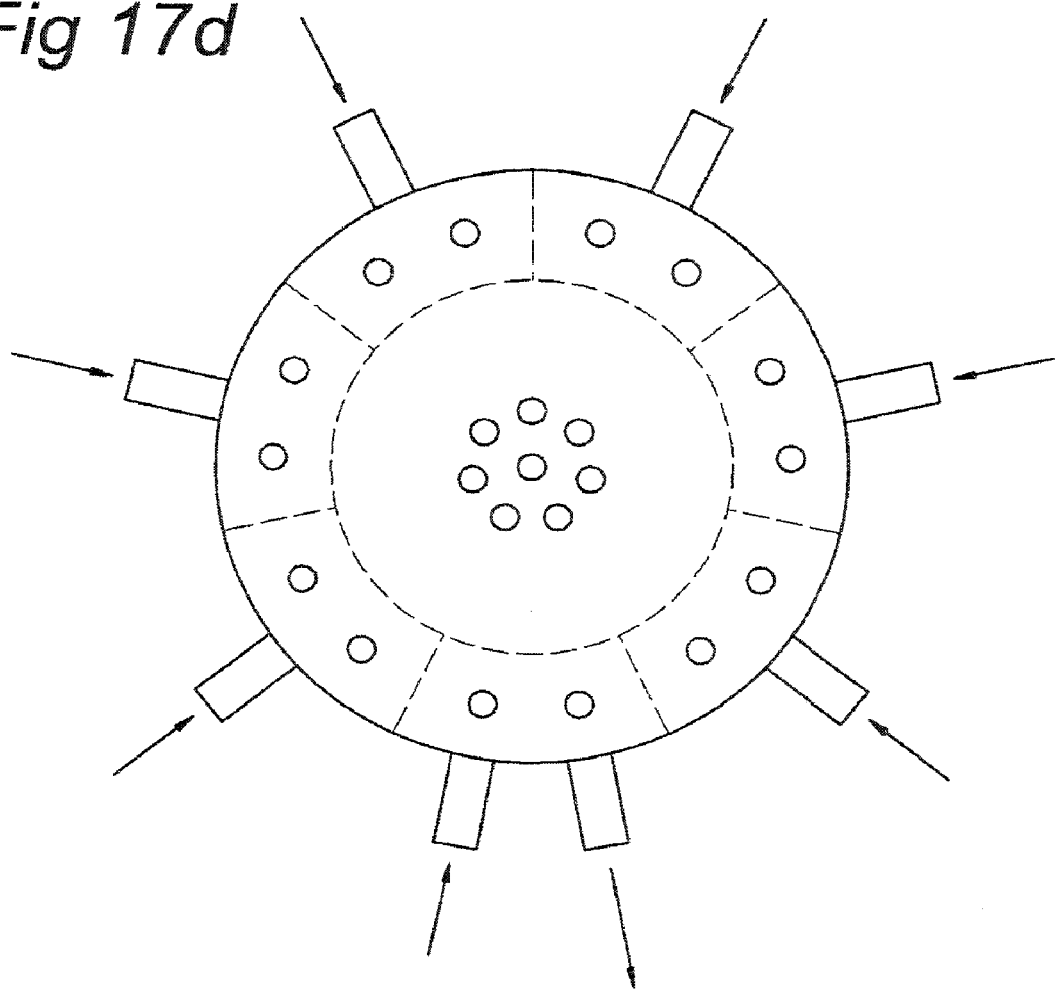

Alternatively, the probe head PH may be split in more than one compartments to create a rotating flow of cleaning fluid. For instance, the probe head may be provided with a central portion and a plurality of outer compartments, as is schematically depicted in FIG. 17d, showing a top view of such a probe head PH. As is schematically depicted, the central portion is extracted and the outer compartments are separately provided with liquid. This way, a rotating flow may be generated.

Figure 18:
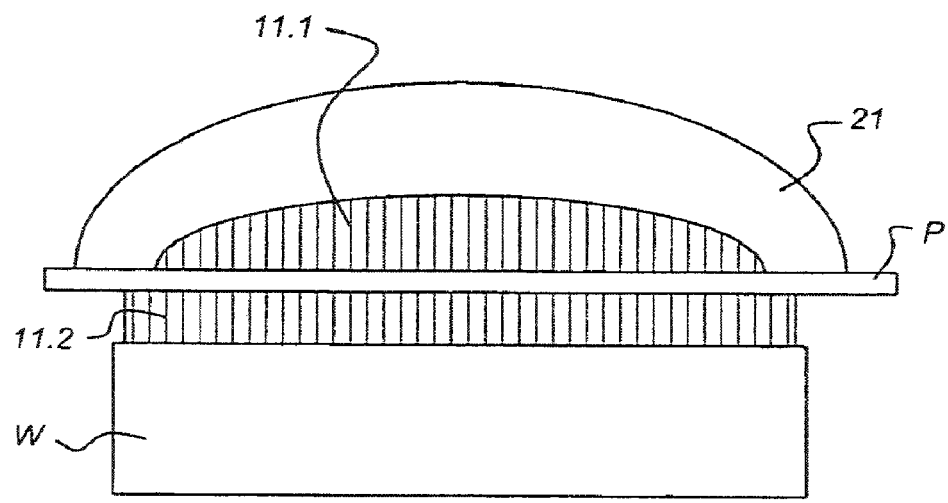
FIG. 18 depict a lens element according to a further embodiment.

According to a further embodiment, the development of a gas entrapment G may be prevented by providing a modified lens element 21, as depicted in FIG. 18. According to this embodiment, lens element 21 is provided with an additional plate P, closing the concavity under lens element 21. The space in between the plate P and the lens element 21 is filled with liquid 11.1. This may be done when manufacturing lens element 21.

The space in between the plate P and the substrate W or substrate table WT may be filled with liquid 11.2.

The plate P may be flat, such that it has minimal influence on the beam PB. Also, the plate PL may be made of a material having a refractive index that is close to or substantially matches the refractive index of the liquid. The plate P may further be relatively thin, to absorb as little radiation as possible.

Also, problems associated with turbulence and temperature gradients are reduced. The plate PL may help to create a laminar flow, which results in a uniform temperature distribution in the liquid, and thus a uniform index distribution. This helps to increase the optical performance.

According to a further embodiment, a further technique is introduced for filling the space under curved lens element 21 with a liquid 11. According to this embodiment, the space in between the lens element 21 and the substrate W or substrate table WT is filled by letting capillary forces push the gas/air out of the concavity of the lens element 21. So, according to this embodiment, the space under the lens element 21 is filled in such a way that no gas entrapment G will occur.

Figure 19A:
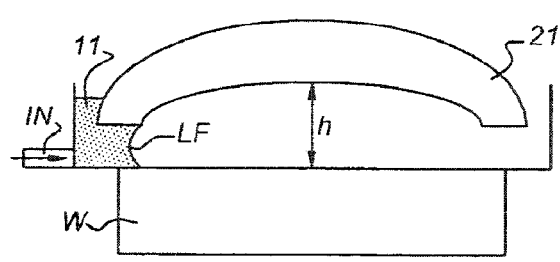
FIGS. 19a-d depict a lens element according to a further embodiment.

The capillary filling technique is schematically depicted in FIGS. 19a-d. FIG. 19a shows a substrate W above which a lens element 21 is positioned and a liquid inlet IN. Liquid 11 is supplied via inlet IN to fill the space under lens element 21. FIG. 19a-d show subsequent phases of the capillary filling procedure. The liquid enters the space under lens element 21. A liquid front LF progresses from the inlet IN into the space under lens element 21, until it is completely filled.

Figure 19B:
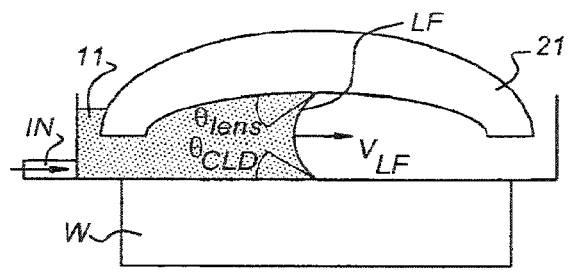
Figure 19C:
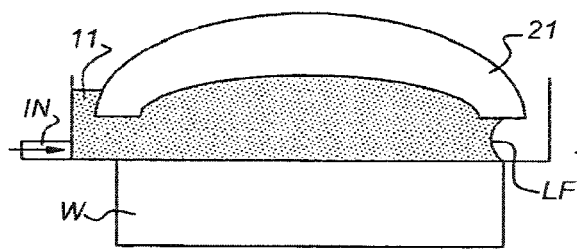
Figure 19D:
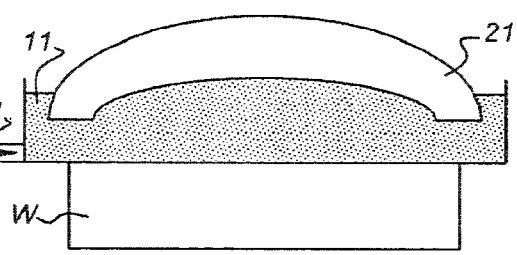

As depicted in FIGS. 19a-c, the liquid front LF is hollow as a result of the adhesive forces between the liquid 11 and the surface of lens element 21 and the adhesive forces between the liquid 11 and the substrate or substrate table WT. As a result of this adhesive forces or capillary forces, the liquid front LF bridges the gap between the lens element 21 and the substrate W or substrate table WT, thereby preventing development of a gas entrapment G.

In a first action, the filling is started by letting liquid 11 enter the space under the lens element 21 via inlet IN. This is shown in FIG. 19a.

Next, the capillary forces push the meniscus or liquid front LF between the lens element 21 and the substrate W or substrate table WT. This is shown in FIG. 19b.

After a certain time, the liquid front LF reaches the other side of the lens element 21, as depicted in FIG. 19c. Finally, the whole space under lens element 21 is filled with liquid 11, without gas entrapment G.

The success of such a capillary filling technique depends on a number of parameters, such as the height h between the lens element 21 and the substrate W or substrate table WT, the kind of liquid 11 used, the contact angle between the liquid 11 and the lens element 21 and between the liquid 11 and the substrate W or substrate table WT.

For instance, the capillary filling technique is possible up to a maximum height $h_{max}$ between the lens element 21 and the substrate W of substrate table WT, where the surface tension of the liquid 11 is no longer able to maintain the meniscus or liquid front LF due to gravitational forces.

The (advancing) contact angle of the lens element 21 and the substrate W or substrate table WT is also of importance. The angle $\theta_{lens}$ is the angle through the liquid from lens to meniscus. The angle $\theta_{CLD}$ is the angle through the liquid from closing member to meniscus, where the closing member may be a substrate W, substrate table WT, or closing disk. These angles are depicted in FIG. 19b.

More hydrophilic (or higher affinity with the immersion liquid, not restricted to water) means higher capillary forces and thus a larger height $h_{max}$ that may be bridged. Roughly the relationship between liquid and surface properties and the maximum gap $h_{max}$ is given by:

$$\left. \begin{array}{c} p_{cap} = \dfrac{\gamma \cdot (\cos(\theta_{LENS}) - \cos(\theta_{CLD}))}{h} \\ p_g = \rho \cdot g \cdot h \end{array} \right\} \Rightarrow$$

-continued $$h \approx \sqrt{\frac{\gamma \cdot (\cos(\theta_{LENS}) - \cos(\theta_{CLD}))}{\rho \cdot g}},$$

wherein $p_{cap}$ capillary pressure,
  $\gamma$ fluid surface tension,
  $\theta_{lens}$ advancing contact angle of the fluid on the lens element 21,
  $\theta_{CLD}$ the advancing contact angle of the fluid on the closing member surface, such as substrate W or substrate table WT,
  h distance between lens element 21 and substrate W,
  $p_g$ gravitational pressure,
  $\rho$ fluid density,
  g gravitational constant.

When the liquid 11 is water, and the contact angles ($\theta_{lens}$, $\theta_{CLD}$) up to 60°, the maximum height $h_{max}$ is approximately 2.7 mm. For decalin (surface tension 30 mN/m, density 900 kg/m$^3$) the calculation comes to a maximum height of $h_{max}$ approximately 1.8 mm.

Liquid 11 is supplied via inlet IN to fill the space under lens element 21. In order to successfully fill the space under lens element 21 the filling velocity $v_{LF}$ of the liquid front LF, and consequently, the filling flow rate through inlet IN, should not be too high. In case the liquid 11 is supplied too fast, the hollow liquid front LF may be disturbed and may 'break' or 'collapse'. Once this happens, the liquid front LF no longer bridges the gap between the lens element 21 and the substrate W or substrate table WT and air entrapment G may be formed.

The velocity $v_{LF}$ of the liquid front LF should be chosen according to two criteria:

1) microscopic collapse, and 2) pressure collapse, which will both be explained in more detail below.

If the velocity $v_{LF}$ of the liquid front LF is too high, the bulk of the liquid 11 may overtake the advancing meniscus or liquid front LF. As a result the concave liquid front LF may become less concave or even convex, causing the liquid front LF to collapse.

Therefore, the velocity $v_{LF}$ of the liquid front LF may be chosen in such a way that the velocity $v_{LF}$ of the liquid front LF doesn't exceed the advancing meniscus or liquid front LF velocity, given by Vionov's equation:

$$v_{vionov} = \frac{1}{A}\frac{\gamma}{\eta}(\theta_{dyn}^3 - \theta_{stat}^3),$$

wherein $v_{vionov}$ velocity of advancing meniscus or liquid front LF,
  A typical parameter for stable performance, for water A may typically be 250, for decalin 100,
  $\gamma$ fluid surface tension,
  $\eta$ viscosity,
  $\theta_{dyn}$ maximum advancing dynamic contact angle,
  $\theta_{stat}$ maximum advancing static contact angle of both surfaces i.e. lens element 21 and closing member surface.

A is a typical value for stable performance for water, A=250 is expected for water, A=100 is expected for decalin.

$\theta_{dyn}$ is the maximum advancing dynamic contact angle that can be reached before the liquid front LF or meniscus "trips" and air inclusions or gas entrapments occur. Theoretically $\theta_{dyn}$ is 180°, for robustness usually a lower value is taken, e.g. 120°. This is done so it can deal with artifacts like scratches on the surface or contaminations (particles, deposits, etc.).

$\theta_{stat}$ is the static advancing contact angle, the angle the advancing meniscus or liquid front makes with a surface just before it starts to move. These values can be measured with dynamic contact angle measuring devices, e.g. the Krüss Drop Shape Analysis System (DSA10, DSA100s), as will be understood by a skilled person. The $\theta_{static}$ for the lens material is referred to as $\theta_{lens}$, for the closing member (e.g. substrate W or substrate table WT) as $\theta_{CLD}$.

The velocity $v_{LF}$ of the liquid front LF and consequently, the filling flow rate of the liquid 11 through inlet IN, are to be chosen such that the velocity of the liquid front LF $v_{LF}$, as indicated in FIG. 19b, doesn't exceed the velocity $v_{vionov}$ based on Vionov's equation.

For instance, when the liquid 11 is water, this results in:

| $\theta_{stat}$ | Material lens element 21 | $\theta_{max}$ = 180° | $\theta_{max}$ = 150° | $\theta_{max}$ = 120° | $\theta_{max}$ = 90° |
|---|---|---|---|---|---|
| 50° | Quartz | 8.9 m/s | 5.0 m/s | 2.5 m/s | 0.1 m/s |
| 130° | Teflon | 6.8 m/s | 3.0 m/s | 0.4 m/s | — |

For instance, when the liquid 11 is decalin ($\gamma$=30 mN/m and $\eta \approx$30 mPa·s), this results in:

| $\theta$stat | Material lens element 21 | $\theta_{max}$ = 180° | $\theta_{max}$ = 150° | $\theta_{max}$ = 120° | $\theta_{max}$ = 90° |
|---|---|---|---|---|---|
| 0° | Quartz | 1.1 m/s | 0.6 m/s | 0.3 m/s | 0.1 m/s |
| 60° | Teflon | 1.0 m/s | 0.6 m/s | 0.3 m/s | — |

The choice of material of the substrate W or substrate table WT determines the highest (static and thus the speed of microscopic collapse.

Microscopic collapse may occur on both contact surfaces, so on the last lens element (made of quartz or LuAG) and on the closing member (substrate, substrate table, closing member, made of glass, silicon, silicon carbide, ZERODUR, ULE, etc, possibly coated with teflon).

So, based on the above, the velocity of the liquid front $v_{LF}$ should be kept below a first velocity vmicro, where $v_{micro}=v_{vionov}$.

Figure 20A:
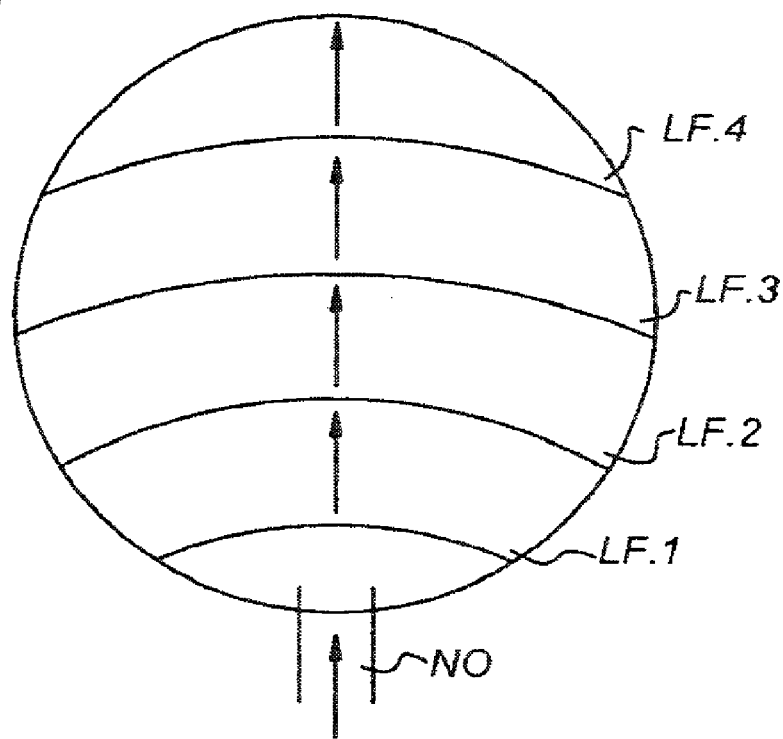
FIGS. 20a-b depict a top view of a lens element according to a further embodiment.

FIG. 20a shows a top view of a filling process. The figure depicts a nozzle NO supplying liquid 11 to the space under the lens element 21. The figure further shows the subsequent positions of the liquid front LF at subsequent moments in time LF.1, LF.2, LF.3, LF.4.

A suitable filling speed may be computed, based on a meniscus overrun criterion, i.e. the filling pressure $p_{fill}$ should not be too high, as it will destroy the meniscus. The mathematics then becomes:

$$p_{cap} = p_{fill} + p_{grav} + \Delta p_{visc} + p_{inertia}$$

Figure 20B:
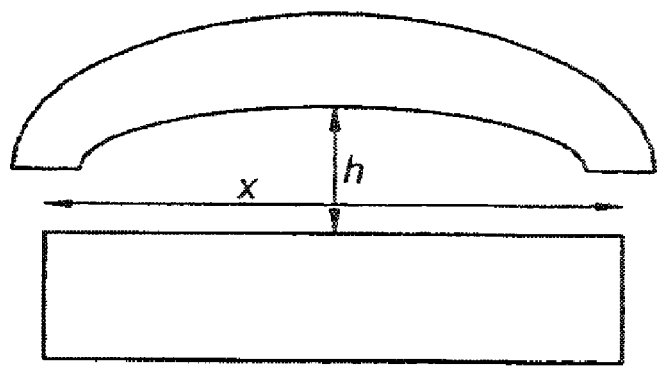

This formula generally expresses that the filling pressure $p_{fill}$ is to be balanced with the other pressure terms mentioned, to prevent the meniscus from being overrun. The other pressure terms are a capillary pressure $p_{cap}$, a gravitational pressure $p_{grav}$, a viscous pressure $p_{visc}$ and a inert pressure term $p_{inertia}$. The different pressure term will be explained in more detail below:

$$p_{cap} = \frac{\gamma}{h}(\cos\theta_{lens(v)} + \cos\theta_{CD(v)}),$$

wherein γ represents the surface tension, h the local gap height, $\theta_{lens(v)}$ the dynamic contact angle on lens at meniscus speed v, and $\theta_{CD(v)}$ the dynamic contact angle on lens at closing member speed v. $\theta_{xxx(v)}$ may be computed using Vionov's equation:

$$(\theta_{dyn}^3 - \theta_{stat}^3) = \frac{A\eta}{\gamma}v,$$

with A~250 for water, ~100 for high refractive index oils like decalin;

$$p_{grav} = \rho g h,$$

where ρ represents the density of the liquid, g equals 9.81 m/s² and h is the gap height, as indicated in FIG. 20b;

$$\Delta p_{visc} = \frac{C_1 \eta x}{h^3 Q}$$

where, $C_1$ represents a constant depending on flow pattern, η the viscosity of the liquid and Q the flow per unit area;

$$p_{inertia} = c_2 \rho v^2,$$

where $C_2$ is a constant depending on flow pattern.

Based on the above a threshold filling pressure may be computed. The actual filling pressure pfill should not exceed this threshold filling pressure to prevent gas entrapments to occur.

Furthermore the flow balance linking the flow into the movement speed of the meniscus and the flow velocity distribution over gap height needs to balanced. The pressure balance has to be fulfilled on all heights. If not, the meniscus locally buckles and air inclusions occur.

It should be appreciated that in order to fulfil both criteria discussed above, the filling fluid rate through inlet IN needs to be controlled in such a way that the velocity of the liquid front LF $v_{LF}$, being pushed forwards by the liquid 11 coming in via inlet IN, doesn't exceed maximum velocity $v_{max}$ as determined according to the above. In order to do this, the fluid rate through the inlet IN may be varied during the filling process. It should be appreciated that the maximum allowable filling rate may be inversely proportional to the size of the liquid front LF.

When the filling has just commenced, the liquid front LF is relatively small, as can be seen in FIG. 20a (LF.1). In that case, the fluid rate through inlet IN should be kept relatively low. When the filling is halfway, the liquid front LF is relatively large (LF.3), as can be seen in FIG. 20a. In that case, the fluid rate may be higher.

It should be appreciated that the filling method as described above is not restricted to filling hollow lens elements 21, but may also be used for fillings space under flat lens elements 21 or convex lens elements 21.

This text above refers to the space in between lens element 21 and the substrate W or substrate table WT. It should be appreciated that instead of a substrate W or substrate table WT any closing member may be used. After the space under lens element 21 has been filled with a liquid according to any of the embodiments described above, the closing member may be replaced by a substrate W or substrate table WT. In fact, a special closing member may be chosen, made of a specific material, having material features that are suitable for relative quick filling.

In an embodiment, there is provided a lens element, for use in a projection system, the lens element comprising: a concave side; a membrane; and a nozzle, wherein the membrane covers the concave side, and the nozzle is configured to supply and/or remove a liquid and/or a gas in between the concave side and the membrane.

In an embodiment, the membrane is made of a pellicle material. In an embodiment, the membrane is made of TEFLON AF or CYTOP. In an embodiment, the lens element is made of a material having a refractive index between 1 and 1.7. In an embodiment, the membrane is attached to the lens element by a glue seam. In an embodiment, the membrane comprises perforations. In an embodiment, the membrane is rigid and substantially follows the concave side of the lens element. In an embodiment, the membrane comprises a spacer at a side facing the concave side of the lens element configured to prevent the membrane from sticking against the concave side of the lens element.

In an embodiment, there is provided a method of supplying a liquid to a space in between a lens element of a projection system and a closing member, the lens element comprising a concave side, the closing member facing the concave side of the lens element, wherein the lens element further comprises a membrane, the membrane covering the concave side of the lens element, the method comprising: supplying a first liquid and/or a gas in between the concave side and the membrane via the nozzle; and supplying a second liquid in between the membrane and the closing member.

In an embodiment, supplying the second liquid is done after supplying the first liquid and/or gas. In an embodiment, supplying the first liquid and/or gas is done after supplying the second liquid. In an embodiment, the method further comprises removing the first liquid and/or gas from between the concave side and the membrane after supplying the first liquid and/or gas and after supplying the second liquid. In an embodiment, the first liquid and the second liquid are different.

In an embodiment, there is provided a method of supplying a liquid to a space in between a lens element of a projection system and a closing member, the lens element comprising a concave side, the closing member facing the concave side of the lens element, the lens element further comprising a membrane, the membrane covering the concave side of the lens element, the method comprising: supplying a liquid in between the concave side and the closing member; and extracting air from between the membrane and the closing member.

In an embodiment, there is provided a membrane, comprising: a first membrane layer and a second membrane layer, the first membrane layer and the second membrane layer being attached to each other to form an internal space; a nozzle configured to supplying and/or remove a liquid and/or a gas in between the first membrane layer and the second membrane layer.

In an embodiment, the first membrane layer and the second membrane layer are attached to other by a seam. In an embodiment, the seam is a glue seam. In an embodiment, the membrane is configured to be attached to a lens element. In an embodiment, the membrane is made of a pellicle material. In an embodiment, the membrane is made of TEFLON AF or CYTOP.

In an embodiment, there is provided a method for providing a liquid to a space in between a concave lens element of a projection system and a closing member, the closing member facing the concave lens element, the method comprising: a) providing a membrane in a space under the concave lens element, the membrane comprising a first membrane layer and a second membrane layer, the first membrane layer and the second membrane layer being attached to each other to form an internal space and a nozzle configured to supplying and/or remove a liquid and/or a gas in between the first membrane layer and the second membrane layer; b) supplying a first liquid in the space; c) supplying a second liquid and/or gas in between the first membrane layer and the second membrane layer via the nozzle; and d) removing the membrane from the space under the concave lens element.

In an embodiment, the method further comprises removing the second liquid and/or gas from between the first membrane layer and the second membrane layer via the nozzle. In an embodiment, a), b), c) and d) are done sequentially. In an embodiment, a), c), b) and d) are done sequentially. In an embodiment, the first liquid and the second liquid are different.

In an embodiment, there is provide a method for providing a liquid to a space in between a concave lens element of a projection system and a closing member, the closing member facing the concave lens element, the method comprising: a) supplying liquid in the space between the concave side and the closing member; b) introducing a tube into the space and positioning an end of the tube near the concave lens element; c) applying a suction force to the tube in a direction away from the end of the tube near the concave lens element; and d) removing the tube from the space.

In an embodiment, the tube is provided with a joint and/or an extendable part to position the end of the tube near the concave lens element. In an embodiment, the tube is provided with a probe head shaped according to the concave lens element.

In an embodiment, there is provided a method of filling a space under a lens element with a liquid, wherein the space is limited at a first side by the lens element and at a second side by a closing member surface and the liquid is supplied to the space via an inlet such that a liquid front travels through the space under the lens element, the method comprising: controlling a flow rate of the liquid through the inlet such that a velocity of the liquid front is below a first velocity, and a filling pressure does not exceed a threshold filling pressure such that the space is completely filled with the liquid.

In an embodiment, the first velocity is given by $$v_{vionov} = \frac{1}{250}\frac{\gamma}{\eta}(\theta_{max}^3 - \theta_{stat}^3),$$

wherein $\gamma$ is fluid surface tension, $\eta$ is viscosity, $\theta_{max}$ is maximum advancing dynamic contact angle, and $\theta_{stat}$ is maximum advancing static contact angle of a surface of the lens element and the closing member surface. In an embodiment, the threshold filling pressure $p_{fill}$ is given by $p_{cap} = p_{fill} + p_{grav} + \Delta p_{visc} + p_{inertia}$, wherein $p_{cap}$ is a capillary pressure, $p_{grav}$ is a gravitational pressure, $p_{visc}$ is a viscous pressure $p_{visc}$ and $p_{inertia}$ an inert pressure term.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lens element, comprising:
   a membrane attached to the lens element, the membrane having:
      a first membrane layer and a second membrane layer, the first membrane layer and the second membrane layer being attached to each other to form an internal space; and
      a nozzle connected to the first membrane layer and the second membrane layer, the nozzle configured to supply and/or remove a liquid and/or a gas in between the first membrane layer and the second membrane layer, wherein the first membrane layer comprises a plurality of perforations or the second membrane layer comprises a plurality of perforations.

2. The lens element according to claim 1, wherein the first membrane layer and the second membrane layer are attached to each other by a seam.

3. The lens element according to claim 2, wherein the seam is a glue seam.

4. The lens element according to claim 1, wherein the membrane is made of a pellicle material.

5. The lens element according to claim 4, wherein the membrane is made of a fluoropolymer.

6. A membrane, comprising:
- a first membrane layer and a second membrane layer, the first membrane layer and the second membrane layer being attached to each other to form an internal space; and
- a nozzle connected to the first membrane layer and the second membrane layer, the nozzle configured to supply and/or remove a liquid and/or a gas in between the first membrane layer and the second membrane layer,
- wherein the first membrane layer comprises a plurality of perforations or the second membrane layer comprises a plurality of perforations.

7. The membrane according to claim 6, wherein the first membrane layer and the second membrane layer are attached to each other by a seam.

8. The membrane according to claim 7, wherein the seam is a glue seam.

9. The membrane according to claim 6, wherein the membrane is made of a pellicle material.

10. The membrane according to claim 9, wherein the membrane is made of a fluoropolymer.

11. The membrane according to claim 6, wherein a portion of the membrane is rigid and has a convex surface to substantially follow a concave surface of a lens element.

12. The membrane according to claim 6, comprising a spacer on an external surface of the first membrane layer and/or the second membrane layer to prevent the membrane from sticking against a surface of a lens element.

13. A method for providing a liquid to a space in between a lens element of a projection system and a closing member, the closing member facing the lens element, the method comprising:
- providing a membrane in a space under the lens element, the membrane comprising a first membrane layer and a second membrane layer, the first membrane layer and the second membrane layer being attached to each other to form an internal space and a nozzle connected to the first membrane layer and the second membrane layer, the nozzle configured to supply and/or remove a liquid and/or a gas in between the first membrane layer and the second membrane layer and wherein the first membrane layer is permeable or the second membrane layer is permeable;
- supplying a liquid in the space to contact at least part of the membrane and the closing member; and
- removing liquid and/or a gas via the permeable first membrane layer or permeable second membrane layer and then the nozzle.

14. The method according to claim 13, further comprising removing the membrane from the space under the lens element.

15. The method according to claim 13, wherein the first membrane layer comprises a plurality of perforations or the second membrane layer comprises a plurality of perforations.

16. The method according to claim 13, wherein the membrane comprises a spacer between the membrane and the lens element and on an external surface of the first membrane layer and/or the second membrane layer.

17. The method according to claim 13, wherein a portion of the membrane is rigid and has a convex surface to substantially follow a surface of the lens element.

18. The method according to claim 13, wherein the first membrane layer and the second membrane layer are attached to each other by a seam.

19. The method according to claim 13, wherein the membrane is attached to the lens element by a glue seam.

20. The method according to claim 13, wherein the membrane is made of a fluoropolymer.

* * * * *